US009269189B1

(12) United States Patent
Marinov et al.

(10) Patent No.: US 9,269,189 B1
(45) Date of Patent: Feb. 23, 2016

(54) CONVERSION OF T-SPLINE MODELS TO TRIM-FREE T-SPLINE MODELS: FUNCTIONAL CASE

(71) Applicant: Autodesk, Inc., San Rafael, CA (US)

(72) Inventors: Martin Cvetanov Marinov, Cambridge (GB); Adam Helps, Spanish Fork, UT (US); Gordon Thomas Finnigan, Cambridge (GB); Thomas Warren Sederberg, Orem, UT (US); Xin Li, Hefei (CN)

(73) Assignee: Autodesk, Inc., San Rafael, CA (US)

( * ) Notice: Subject to any disclaimer, the term of this patent is extended or adjusted under 35 U.S.C. 154(b) by 324 days.

(21) Appl. No.: 13/827,243

(22) Filed: Mar. 14, 2013

Related U.S. Application Data

(60) Provisional application No. 61/744,827, filed on Oct. 3, 2012.

(51) Int. Cl.
G06T 17/20 (2006.01)
G06F 17/50 (2006.01)

(52) U.S. Cl.
CPC ........... *G06T 17/205* (2013.01); *G06F 17/5018* (2013.01)

(58) Field of Classification Search
None
See application file for complete search history.

(56) References Cited

U.S. PATENT DOCUMENTS 7,274,364 B2 * 9/2007 Sederberg ..................... 345/420
8,310,481 B2 * 11/2012 Bailey ........................... 345/420
2009/0024370 A1 * 1/2009 Scott et al. ........................ 703/2

OTHER PUBLICATIONS

Li, Wan Chiu, et al. "Automatic and Interactive Mesh to T-Spline Conversion" 4th Eurographics Symposium on Geometry Processing (2006) available from <https://hal.inria.fr/inria-00105611>.*
Sederberg, Thomas W., et al. "T-Splines and T-NURCCs" ACM Transactions on Graphics, ACM SIGGRAPH '03, vol. 22, issue 3, pp. 477-484 (2003) available from <http://dl.acm.org/citation.cfm?id=882295>.*
Sederberg, Thomas W., et al. "T-spline Simplification and Local Refinement" ACM Transactions on Graphics, ACM SIGGRAPH '04, vol. 23, issue 3, pp. 276-283 (2004) available from <http://dl.acm.org/citation.cfm?id=1015715>.*
Scott, M.A., et al. "Local refinement of analysis-suitable T-splines" Computer Methods in Applied Mechanics & Engineering, vols. 213-216, pp. 206-222 (Dec. 6, 2011) available from <http://www.sciencedirect.com/science/article/pii/S0045782511003689>.*
Sederberg, Thomas W., et al. "Watertight trimmed NURBS" ACM Transactions on Graphics, ACM SIGGRAPH '08, vol. 27, issue 3 (2008) available from <http://dl.acm.org/citation.cfm?doid=1360612.1360678>.*

* cited by examiner

*Primary Examiner* — Aniss Chad
*Assistant Examiner* — Jay B Hann
(74) *Attorney, Agent, or Firm* — Fish & Richardson P.C.

(57) ABSTRACT

Methods, systems, and apparatus, including computer programs encoded on a computer storage medium, for constructing a trim-free T-spline surface and control mesh for a NURBS surface control grid of a B-rep face; modifying the trim-free T-spline control mesh to align the trim-free T-spline surface boundary with a functional trimming curve; and redefining one or more faces in the modified trim-free T-spline control mesh that is adjacent to the trimming curve as a variable knot spline face.

27 Claims, 21 Drawing Sheets

400

402 — Assign knot intervals to edges that are split by a T-junction extension

404 — Define blending functions for a VKS with T-junctions

406 — Split macro patches into sub-patches

408 — Determine a pair of tangent strips for each edge

FIG. 4

(a) Knot Intervals.

(b) Determining the Degree of an Edge.

(a) Face Point Construction.

(b) Intermediate Points.

(a) Control points from $Q_{ij}^{3\times3}$ and $Q_{i,j-1}^{3\times3}$ (b) Control points from $\tilde{Q}_{i,j-1}^{6\times6}$ and $\tilde{Q}_{ij}^{6\times6}$.

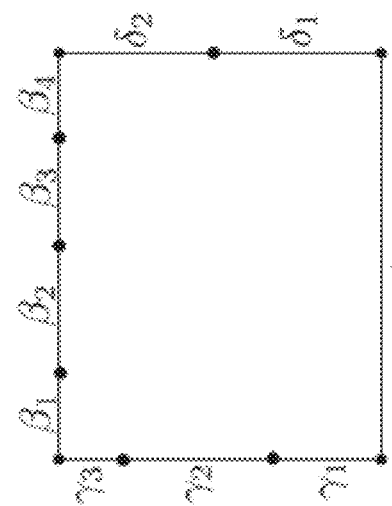
FIG. 21A (a) T-Junction.
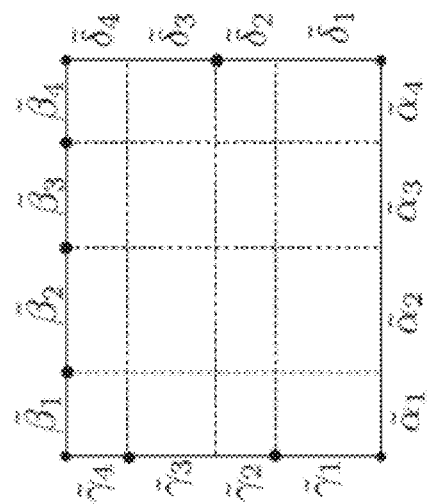
FIG. 21B (b) Extension.
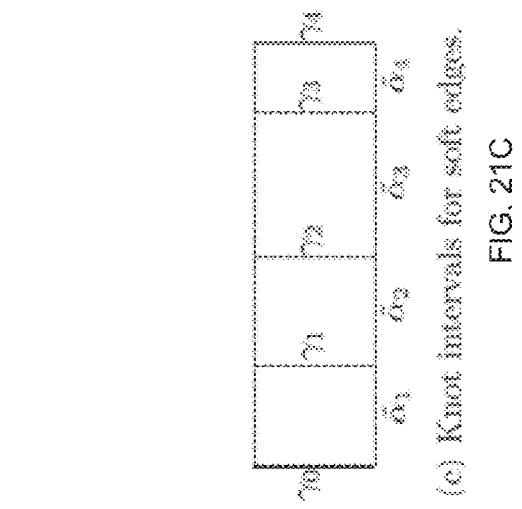
FIG. 21C (c) Knot intervals for soft edges.

(a) T-VKS control grid.

(b) Sixteen Bézier domains for P's blending function.

(c) Coefficients for P's blending function.

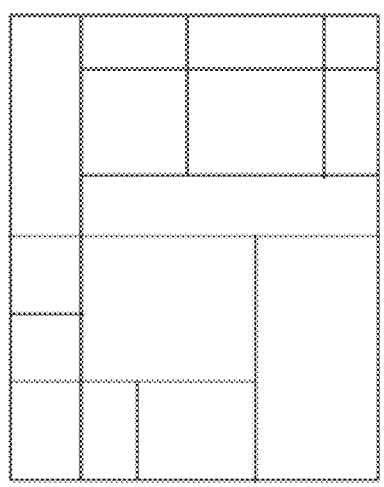
FIG. 24A (a) Domain split of a macro patch.
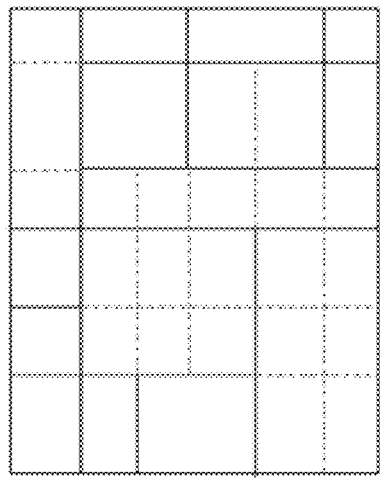
FIG. 24B (b) With T-Junction Extensions (soft edges).

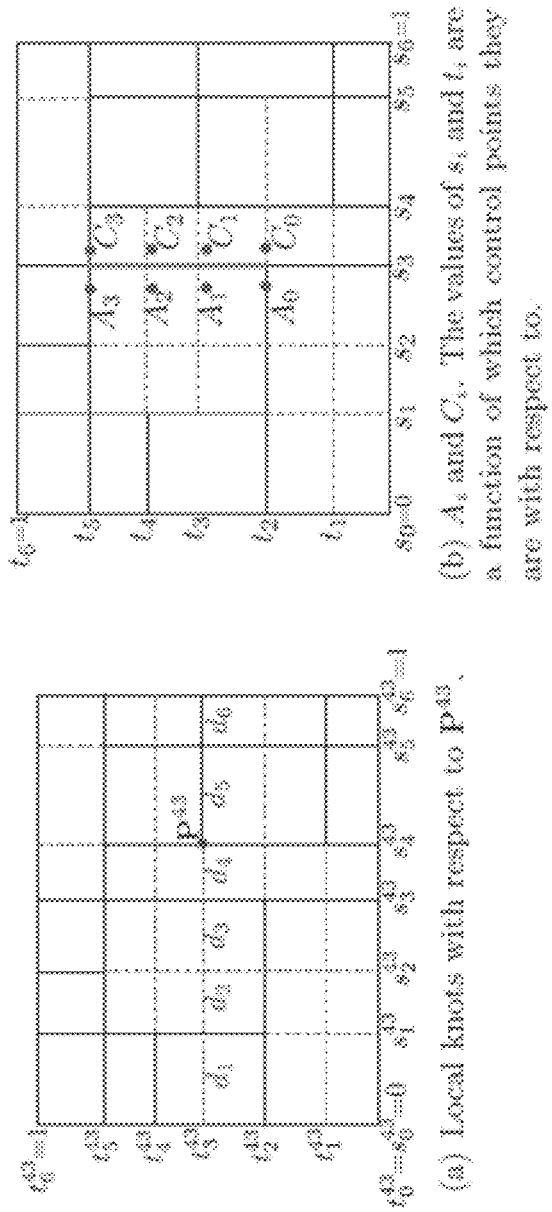
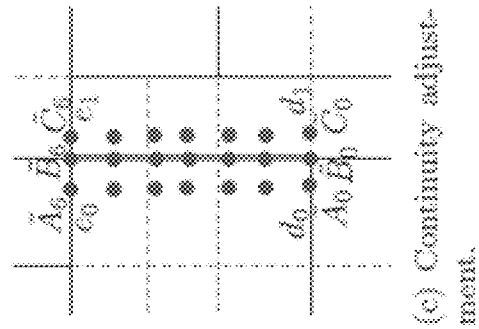
FIG. 25A (a) Local knots with respect to $p^{4,3}$.
FIG. 25B (b) $A_i$ and $C_i$. The values of $s_i$ and $t_i$ are a function of which control points they are with respect to.
FIG. 25C (c) Continuity adjustment.

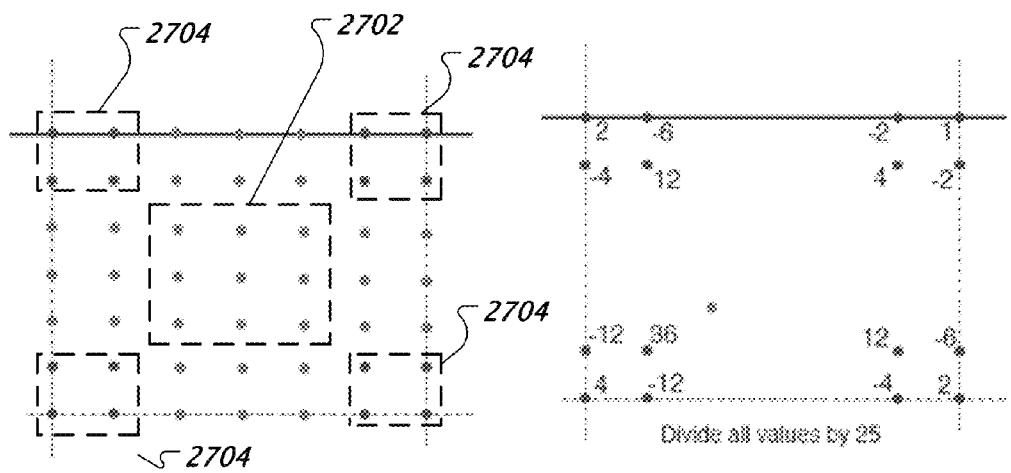
(a) Tangent strip control points are blue and green.
FIG. 27A
(b) Mask for $P_{32}$. Also use for $P_{42}$, $P_{44}$, and $P_{24}$.
FIG. 27B
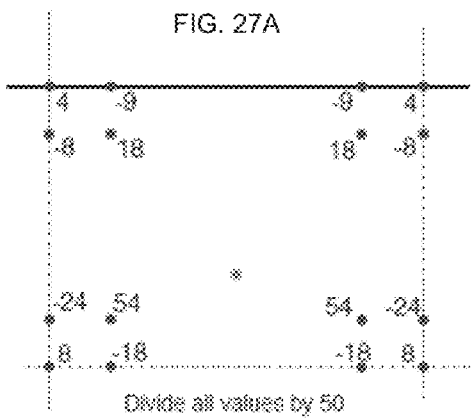
(c) Mask for $P_{22}$. Also use for $P_{23}$, $P_{34}$, and $P_{43}$.
FIG. 27C
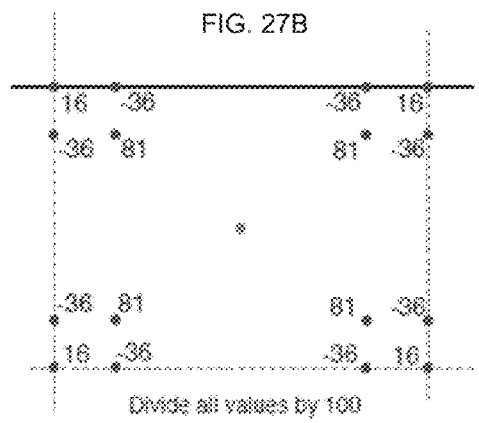
(d) Mask for $P_{33}$.
FIG. 27D

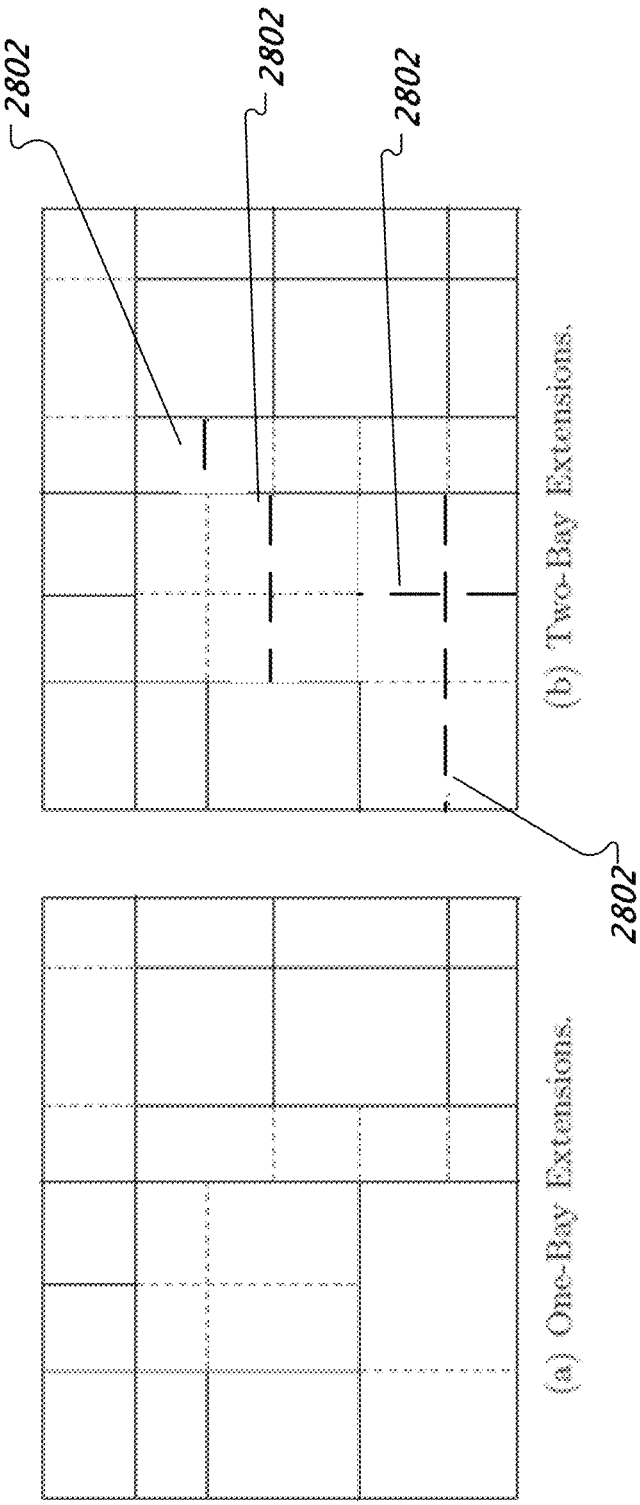

CONVERSION OF T-SPLINE MODELS TO TRIM-FREE T-SPLINE MODELS: FUNCTIONAL CASE

CROSS-REFERENCE TO RELATED APPLICATIONS

This application claims the benefit under 35 U.S.C. §119 (e) of U.S. Provisional Application Ser. No. 61/744,827, filed on Oct. 3, 2012 entitled "Conversion of T-Spline Models to Trim-Free T-Spline Models," the entirety of which is hereby incorporated by reference.

BACKGROUND

This specification relates to computer-aided design (CAD) applications and, in particular, to converting T-spline models to trim-free T-spline models.

Computer-aided design (CAD) can be used to model surfaces that resemble smooth, real-world objects. For example, a boundary representation (B-rep) CAD model typically consists of a collection of surfaces that are augmented using trim curves and that are organized topologically in boundary loops. The B-rep CAD model includes additional geometrical and topological information that represents surface domains in the CAD model. Trim curves can be created using various operations, including, for example, sketching, intersections, and imprinting. Further, trim curves can be defined by complicated geometry that is often more involved mathematically and is more computationally expensive to define than the surfaces that are supporting the curves.

When processing a B-rep CAD model, a downstream algorithm typically has to account for all of the trim curves and boundary loops when determining which regions of the surfaces are included in the model. This added complexity makes some operations, including, for example, direct modeling and simulation, more difficult. As a result, for many downstream operations, such as analysis, a B-rep CAD model is first converted into a simpler trim-free representation, e.g., a polygonal mesh (generally a triangular mesh), which does not require trim curves and boundary loops to define the extent of the model. However, use of polygonal meshes generally results in a loss of precision, sharp features, and important high order geometrical infomiation (e.g., the curvature tensor), and requires a high number of elements. Thus, polygonal meshes are generally a poor substitute for the original surface geometry of a model. Use of polygonal meshes in downstream operations typically results in suboptimal downstream results and, sometimes, outright failures.

SUMMARY

This specification describes a functional case for converting T-spline surfaces with attached boundary representation data, e.g., trim curves, into approximately equivalent trim-free T-spline surfaces (TTS). The trim-free T-spline surfaces can be defined in terms of a trim-free T-spline mesh (TTM). A trim-free T-spline mesh can describe a model, e.g., a B-rep CAD model, without requiring additional geometrical or topological data. As a result, downstream processing of the model is simplified by allowing direct use of trim-free T-spline surfaces for various operations, e.g., simulation, editing, geometry analysis, and evaluation. In some implementations, a surface intersection operation can be used to derive trim curves. In contrast to trimmed non-uniform rational B-spline (NURBS) models, which are generally incapable of being watertight, the surface intersection operation can be used tO produce a watertight CAD model that consists of two or more intersecting surfaces.

In general, one aspect of the subject matter described in this specification can be embodied in a method that includes constructing a trim-free T-spline control mesh for a NURBS surface control grid of a B-rep face; modifying the trim-free T-spline control mesh to align the trim-free T-spline control mesh with a functional trimming curve; and redefining one or more faces in the modified trim-free T-spline control mesh that is adjacent to the trimming curve as a variable knot spline face. Other embodiments of this aspect include corresponding systems, apparatus, and computer program products.

These and other embodiments can optionally include one or more of the following features. Redefining each ace in the trim-free T-spline control mesh that is adjacent to the trimming curve as a variable knot spline face includes labeling knot intervals in a variable knot spline control grid, the variable knot spline control grid corresponding to the control grid of the B-rep face; generating a bicubic surface patch for one or more faces of the variable knot spline control grid; and adjusting control points along a boundary curve for one or more edges in each face that has a degree of six. Generating a bicubic surface patch for one or more faces of the variable knot spline control grid includes generating respective face points for each face of the variable knot spline control grid. Generating respective face points for each face of the variable knot spline control grid further includes computing respective edge and vertex points for each face of the variable knot spline control grid. Generating respective face points for each face of the variable knot spline control grid further includes: generating respective face points for zero knot intervals in the variable knot spline control grid.

A variable knot spline includes T-junctions and redefining each face in the modified trim-free T-spline control mesh that is adjacent to the trimming curve as a variable knot spline face includes: assigning knot intervals to one or more edges that are split by a T-junction extension; defining one or more blending fiinctions for one or more variable knot splines with T-junctions; splitting one or more macro patches into respective sub-patches; determining respective pairs of tangent strips for each edge in the one or more edges; and defining respective outermost two rows of control points for the respective sub-patches based on the respective pairs of tangent strips for the one or more edges. Control points for variable knot splines with T-junctions are linearly mapped to corresponding Bézier control points. Redefining each face in the trim-free T-spline control mesh that is adjacent to the trimming curve as a variable knot spline face further includes: optimizing control point positions in the trim-free T-spline control mesh. The NURBS surface control grid is a T-spline surface control grid.

Particular embodiments of the subject matter described in this specification can be implemented to realize one or more of the following advantages. Downstream processing of a CAD model is simplified by converting boundary representation data, e.g., trim curves, into trim-free T-spline surfaces. Trim-free T-spline surfaces can be used to produce a watertight model consisting of two or more intersecting surfaces. Since a NURBS surface is a special case of a T-spline, a general NURBS surface boundary representation (B-rep) CAD model can also be converted to a trim-free T-spline CAD B-rep model. CAD B-rep models that are converted to trim-free T-spline CAD B-rep models can preserve high order geometry information and user intent and be significantly more compact to process and store.

Fora CAD model consisting entirely of NURBS surfaces, the original geometry, after conversion, can be preserved everywhere except at a small channel next to the trim curves, where the original geometry is approximated to within a user-supplied tolerance. Both the channel and geometry deviation inside it can be made arbitrarily small, therefore rendering the trim-free T-spline surface appropriate even in cases where very high precision is required for downstream processing. The watertight nature of trim-free T-spline surfaces greatly facilitates downstream operations which are often sensitive to the gaps inherent in trimmed-NURBS models. For example, stereolithography and NC machining software work best with a watertight model. Finite element analysis is another application for which the gaps in B-rep models have been vexing—a major reason for the so-called interoperability problem. Recent advances in the field of finite element analysis make it possible to perform analysis directly on a trim-free T-spline model, without the need to perform mesh generation, and thereby mitigating the interoperability problem.

In a CAD B-rep model, approximately watertight models may be constructed by placing corresponding trimmed surface boundaries as close to one another as possible. Because the model relies on the careful positioning of the trim curves and the trimmed NURBS surfaces in order to be approximately watertight, adjustment to their shape can cause gaps to appear, causing the model to no longer be watertight. However, because the ITS does not depend on its control point positions in order to be watertight, it is possible to modify the shape of the TTS by moving its control points, and after having done so the modelwill continue to be watertight.

The details of one or more embodiments of the invention are set forth in the accompanying drawings and the description below. Other features, aspects, and advantages of the invention will become apparent from the description, the drawings, and the claims.

BRIEF DESCRIPTION OF THE DRAWINGS

FIG. 4 is a flow diagram of an example technique for blending variable knot splines that include T-junctions.

FIGS. 21A-C are example illustrations of assigning knot intervals to edges that are split by a T-junction extension.

FIGS. 24A-B are example illustrations of a T-mesh pre-image of a macro patch.

FIGS. 25A-C are example illustrations of defining local knot coordinates for creating tangent strips.

FIGS. 27A-D are example illustrations of a portion of control mesh shown in FIGS. 25A-C.

FIGS. 28A-B are example illustrations of an alternative method for determining control points.

Like reference numbers and designations in the various drawings indicate like elements.

DETAILED DESCRIPTION

Figure 1:
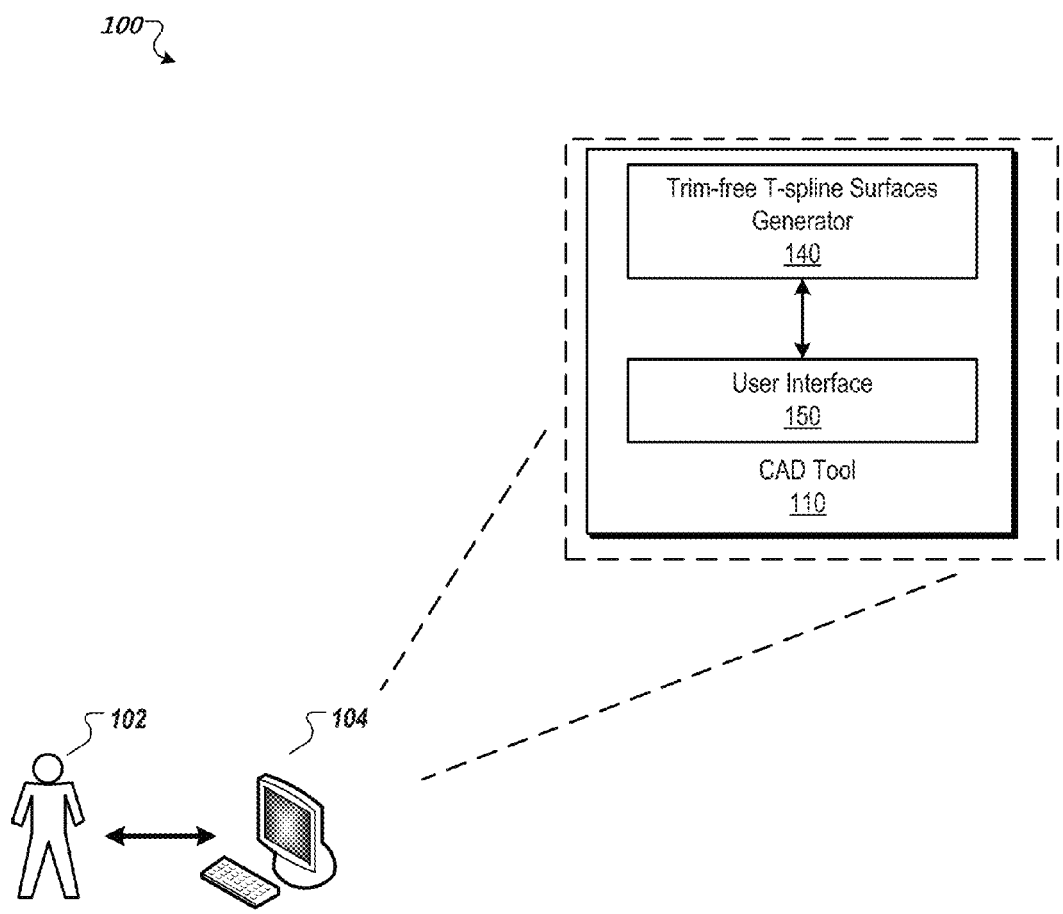
FIG. 1 is a diagram of an example system for generating trim-free T-spline surfaces.

FIG. 1 is a high-level illustration of an example CAD system 100 for generating trim-free T-spline surfaces, Although this diagram depicts objects/processes as logically separate, such depiction is merely for illustrative purposes. The objects/processes portrayed in this figure can be arbitrarily combined or divided into separate software, firmware, or hardware components. Furthermore, such objects/processes, regardless of how they are combined or divided, can execute on the same data processing apparatus or can be distributed among different data processing apparatus connected by one or more naworks (e.g., the Internet).

The CAD system 100 includes a computing device 104, e.g., a laptop or desktop computer, that is capable of executing a CAD tool 110 (e.g., a computer graphics program), The CAD system 100 combines capabilities of a CAD program with common spatial management features, The CAD tool 110 includes, without limitation, a trim-free T-spline surfaces generator 140 and a graphical user interface 150. The CAD tool 110 allows a user 102 to generate and/or load CAD models that describe three-dimensional representations of objects, e.g., models of curved objects, In sonic implementations, the computing device 104 is configured to interact with the CAD tool 110 through a cloud service. The representation can be viewed and, optionally, modified, through the user interface 150. The representation may be freely modeled by the user through the user interface 150 using CAD tool 110. The trim-free T-spline surfaces generator 140 is configured to convert T-spline surfaces, e.g., a B-rep face, into trim-free T-spline surfaces, as described below in reference to FIGS. 2-4.

Figure 2:
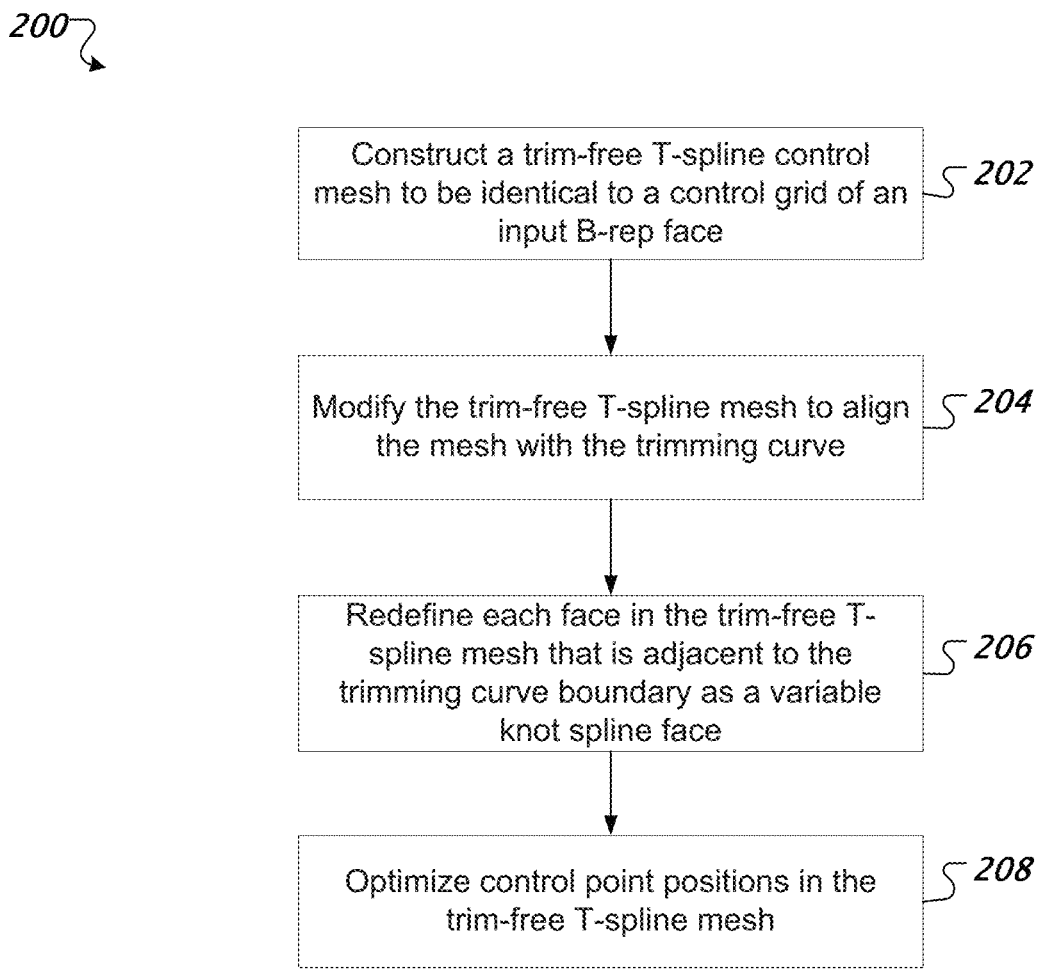
FIG. 2 is a flow diagram of an example technique for generating a trim-free T-spline surface from a NURBS surface.

FIG. 2 is a flow diagram of an example technique 200 for generating a trim-free T-spline surface from a NURBS surface. For convenience, the technique 200 will be described with respect to a system, including one or more data processing apparatus, that performs the technique 200. For example, the technique 200 can be performed by a CAD system, e.g., CAD system 100 of FIG. 1.

Figure 5:
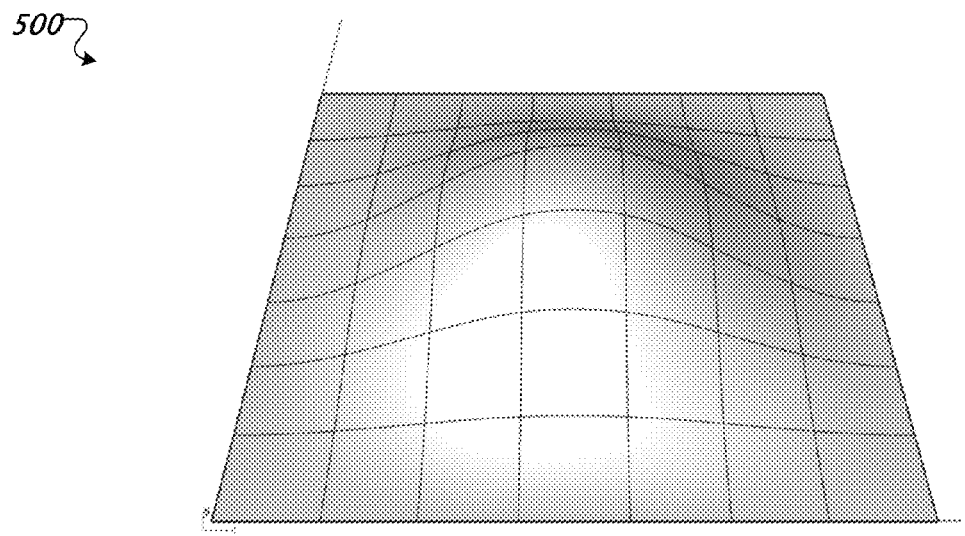
FIG. 5 is an example illustration of a B-rep surface.

The system constructs a trim-free T-spline control mesh to be identical to a control grid of an input B-rep face (202). The untrimmed surface can be, for example, a B-rep face, as shown in FIG. 5. The untrimmed surface $S(s, t)$ of degree $d_s \times d_T$ can be defined by knot vectors $[s_0, s_1, \ldots, s_N] \times [t_0, t_1, \ldots, t_M]$ and a control point grid $\mathbb{P} = \{P_{ij}\}_{i=0 \ldots N-d_s-1, j=0 \ldots M-d_T-1}$ with or without assigned weights. For simplicity of the presentation and without loss of generality, we assume that S is provided in clamped form. That is, $s_0 = s_1 = \ldots = s_{d_s}$, $s_N = s_{N-1} = \ldots = s_{N-d_s}$, $t_0 = t_1 = \ldots = t_{d_T}$ and $t_M = t_{M-1} = \ldots = t_{M-d_T}$. We will, equivalently, represent the knot information in terms of knot intervals.

Further, the untrimmed surface includes a smooth (at least $G^1$) functional trimming curve $\hat{c}(u)$, $u \in [u_0, u_1]$ defined in the domain of the surface S. $G^1$ means first-order geometric continuity. A curve is $G^1$ if it has a continuous tangent direction at each point. A functional trim curve (TC) intersects two opposite boundaries of S and is strictly monotonic in the surface parameter changing between the two opposite boundaries. $\hat{c}(u)$ is a curve in arbitrary representation (not necessarily NURBS) in the domain of S defined by the pair of functions $\hat{c}(u) = (\hat{s}(u), \hat{t}(u))$. As used in this specification, $\hat{c}(u)$ is s-functional when $\hat{s}(u)$ is monotonic, $\hat{s}(u_0) = s_0$, and $\hat{s}(u_1) = s_N$ (or $\hat{s}(u_0) = s_N$, and $\hat{s}(u_1) = s_0$). Correspondingly, $\hat{c}(u)$ is t-functional when $\hat{t}(u)$ is monotonic, $\hat{t}(u_0) = t_0$, and $\hat{t}(u_1) = t_M$ (or $\hat{t}(u_0) = t_M$, and $\hat{t}(u_1) = t_0$). The image of $\hat{c}(u) = S(\hat{c}(u)) = S(\hat{s}(u), \hat{t}(u))$ is a curve lying on the surface S that defines the trim boundary of the input B-rep face.

Figure 6:
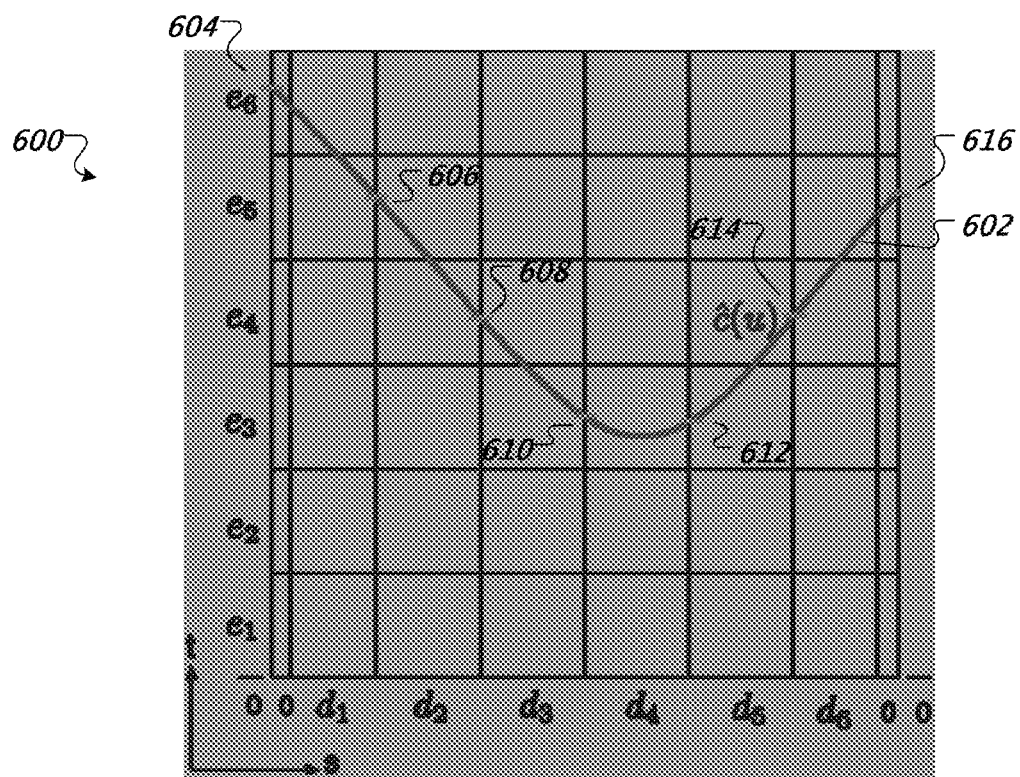
FIG. 6 is an example illustration of a control grid for a NURBS surface including a functional trimming curve over which a trim-free T-spline control mesh is constructed.

FIG. 6 illustrates a control grid 600 for a NURBS surface including a functional trimming curve $\hat{c}(u)$ over which a trim-free T-spline control mesh is constructed. The control grid represents both the NURBS control grid and also the knot lines in the (s, t) parameter domain. In FIG. 5, the NURBS surface is bicubic $d_s = d_T = 3$, however, generalization to other degree input is possible. As shown in FIG. 6, the functional trimming curve $\hat{c}(u)$ 602 is s-fnctional and the knot intervals, in the s- and t-parameter directions are, respectively, $[0, 0, d_1 d_2, \ldots, d_6, 0, 0]$ and $[\ldots, e_1, e_2, \ldots, e_6, \ldots]$.

The system modifies the trim-free T-spline mesh to align the mesh with the trimming curve $\hat{c}(u)$ (204). In some implementations, the system modifies the trim-free T-spline mesh by intersecting the trimming curve $\hat{c}(u)$ with the vertical knot lines. As shown in FIG. 6, the trimming curve $\hat{c}(u)$ is intersected with the vertical knot lines at intersection points 604, 608, 610, 612, 614, and 616.

Figure 7:
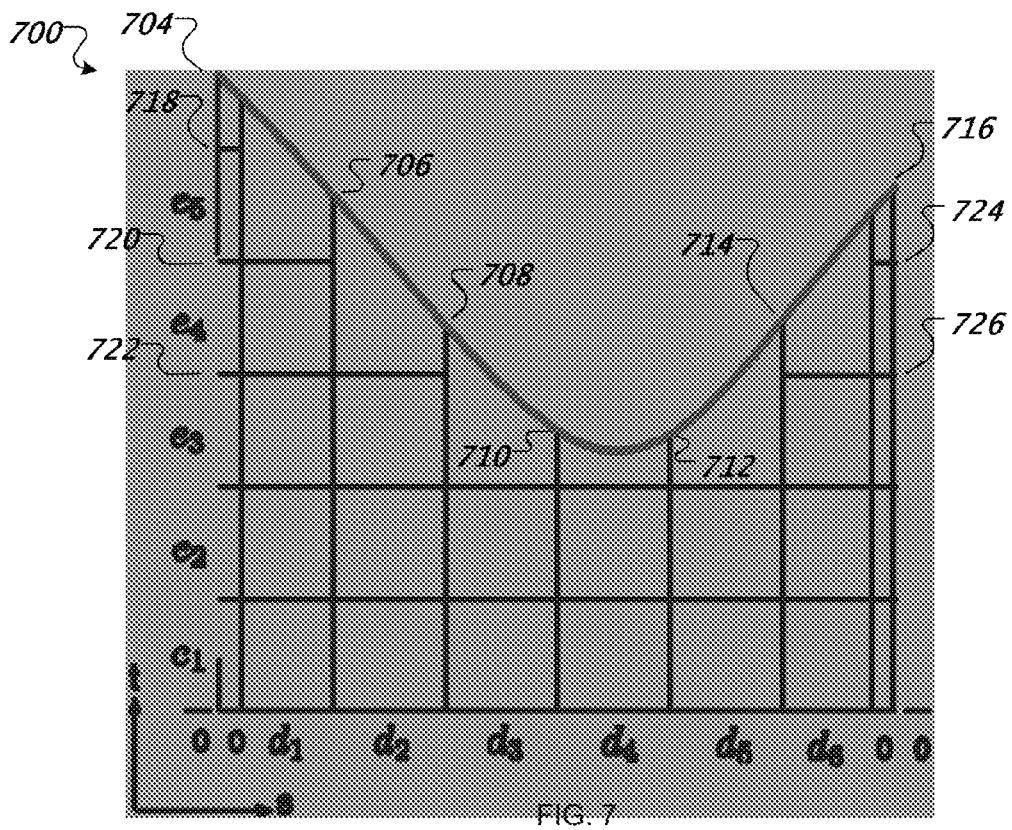
FIG. 7 is an example illustration of modified trim-free T-spline mesh that is aligned with a control grid for a NURBS surface after intersecting a trimming curve.

FIG. 7 illustrates a modified trim-free T-spline mesh 700 that is aligned with a control grid for a NURBS surface after intersecting a trimming curve $\hat{c}(u)$. As shown in FIG. 7, each vertical column 704, 706, 708, 710, 712, 714, and 716, is cut and each horizontal edge segment 718, 720, 722, 724, and 726, whose pre-image intersects $\hat{c}(u)$ is removed, as are all portions of the control grid that lie above $\hat{c}(u)$.

Figure 8:
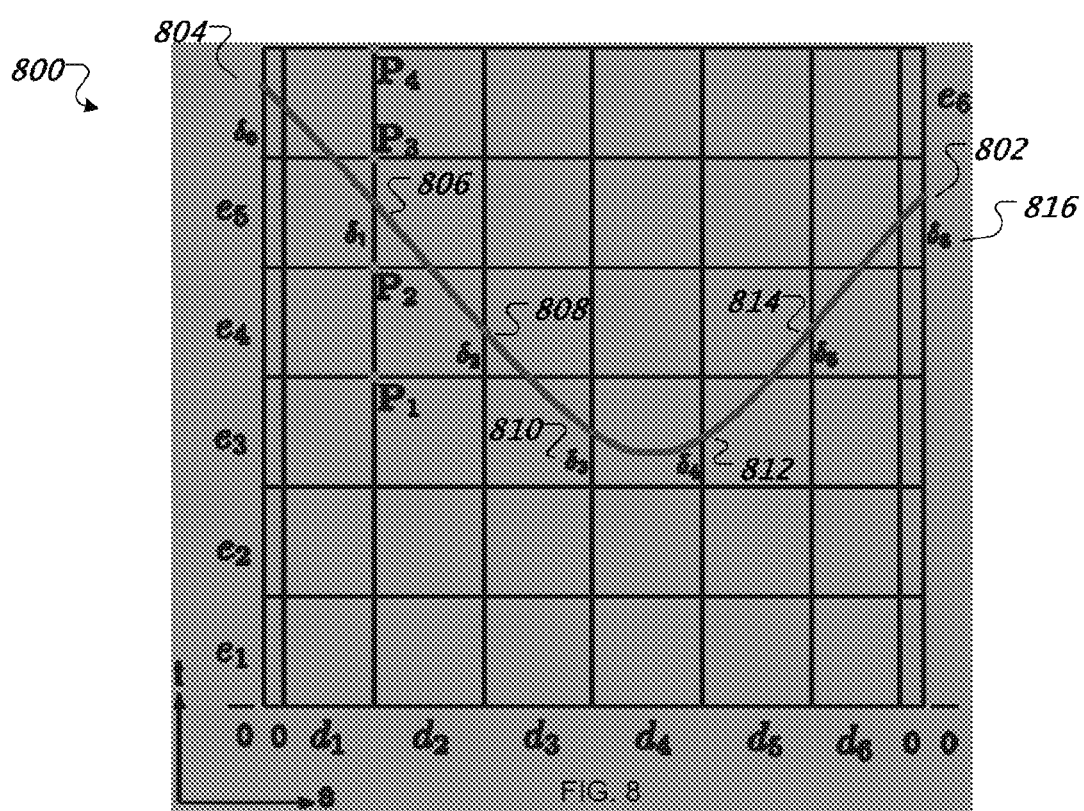
FIG. 8 is an example illustration of intersection parameters for intersected edges corresponding to a trim curve.
Figure 9:
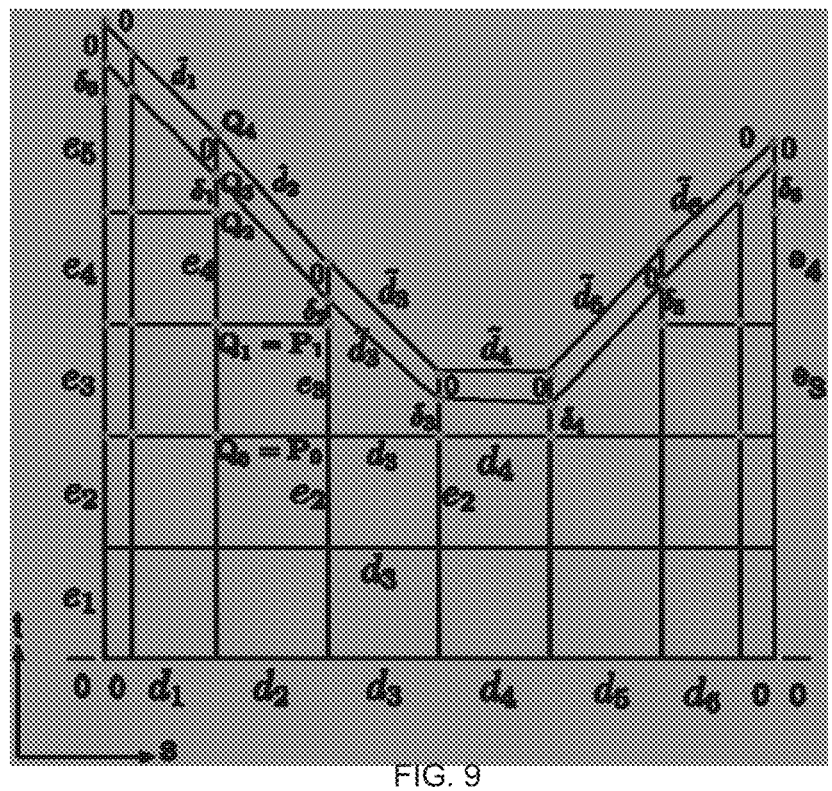
FIG. 9 is an example illustration of a trim-free T-spline mesh.

The system next determines control points for a boundary curve that approximates $c(u)$. When determining control points, the system first determines intersection parameters for the intersected edges. For example, as shown in FIG. 8, the system denotes using $[\delta_0, \delta_1, \ldots, \delta_6]$ the intersection parameters for the intersected edges 804, 806, 808, 810, 812, 814, and 816 corresponding to the trim curve 802. Next, each column of control points of the trim-free T-spline mesh is considered as independent NURBS curves. For example, referring to FIG. 8, each column of control points of the trim-free T-spline mesh is considered as independent NURBS curves $\{b_j(t)\}_{j=0 \ldots 6}$ with a knot vector $[t_0 = 0, t_0, t_0, t_0, t_1 = t_0 + e_1, t_2 = t_1 + e_2, \ldots, t_6 = t_5 + e_6, t_6, t_6, t_6]$. For each $b_j$ the system inserts a triple knot at the respective intersection point. For example, as shown in FIG. 8, at $b_1(t)$, the intersection 806 is at the edge on the fifth row (knot interval $e_5$) and the intersection parameter is $\delta_1$. The triple knot is inserted at $t^* = t_4 + \delta_1 = e_1 + e_2 + e_3 + e_4 + \delta_1$. The system then trims the curve at $t^*$ while retaining the segment in $[0 \ldots t^*]$ resulting in a trimmed curve $\tilde{b}_1(t)$ with knot vector $[t_0, \ldots, t_4, t^*, t^*, t^*, t^*]$. The system merges all trimmed curves $\tilde{b}_j(t)$ to construct the trim-free T-spline mesh, as shown in FIG. 9.

In some implementations, the system performs the triple knot insertion in terms of knot intervals instead of knot values. Using FIG. 8 as an example, the system can generate control points $Q_1, Q_2, Q_3, Q_4$ in terms of the initial NURBS control points $P_1, P_2, P_3, P_4$ as follows:

$$Q_1 = P_1$$

$$Q_2 = \frac{(e_5 - \delta_1)P_1 + (e_3 + e_4 + \delta_1)P_2}{e_3 + e_4 + e_5},$$

$$Q_3 = \frac{(e_5 - \delta_1)Q_2 + (e_4 + \delta_1)A}{e_4 + e_5},$$

$$Q_4 = \frac{(e_5 - \delta_1)Q_3 + \delta_1 C}{e_5}, \text{ where}$$

$$A = \frac{(e_5 + e_6 - \delta_1)P_2 + (e_4 + \delta_1)P_3}{e_4 + e_5 + e_6},$$

$$B = \frac{(e_5 + e_6 + e_7 - \delta_1)P_3 + \delta_1 P_4}{e_5 + e_6 + e_7}, \text{ and}$$

$$C = \frac{(e_5 + e_6 - \delta_1)A + \delta_1 B}{e_5 + e_6}.$$

Figure 10:
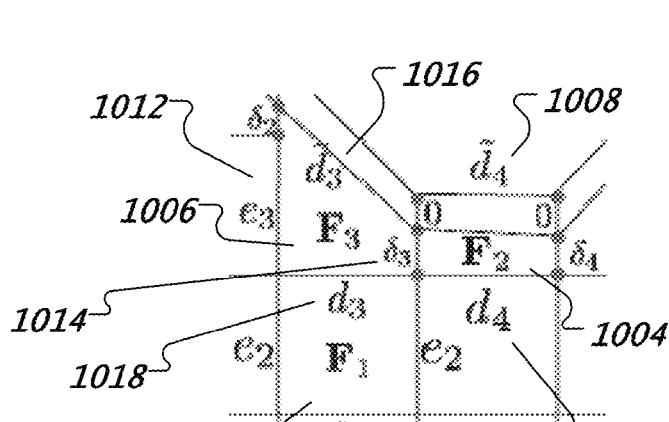
FIG. 10 is an example illustration of the sum of knot intervals on one edge of a face in comparison with the SUM of knot intervals on an opposing edge.

The system redefines each face in the trim-free T-spline mesh that is adjacent to the trimming curve $\hat{c}(u)$ boundary as a variable knot spline face (206). Generally, both NUMBS and T-spline control grids require the sum of knot intervals on one edge of a face to equal the sum of knot intervals on an opposing edge. For example, referring to FIG. 10, the face 1002 satisfies this requirement. The face 1004, however, does not satisfy this requirement because $\delta_3 \neq \delta_4$ and $\tilde{d}_4$ edge 1008 is not equal to $d_4$ edge 1010. Similarly, the face 1006 does not satisfy this requirement because edge 1012 ($e_3 + \delta_2$) is not equal to edge 1014 ($\delta_3$) and edge 1016 ($\tilde{d}_3$) is not equal to edge 1018 ($d_3$). As a result, the control grid shown in FIG. 10 cannot be used as a T-spline control grid. To remedy such a control grid, the system redefines each face in the trim-free T-spline mesh that is adjacent to the trimming curve $\hat{c}(u)$ boundary as a variable knot spline face.

In a variable knot spline (VKS), when the sum of knot intervals on one edge of a face is equal to the sum of knot intervals on an opposing edge, the VKS is treated as a T-spline. However, if the sum of knot intervals on one edge of a face is not equal to the sum of knot intervals on an opposing edge, the VKS produces a smooth surface that is made up of a finite number of $G^1$ surface patches of degree 6×6. Redefining faces as variable knot spline faces is described in reference to FIGS. 3 and 4.

Figure 11:
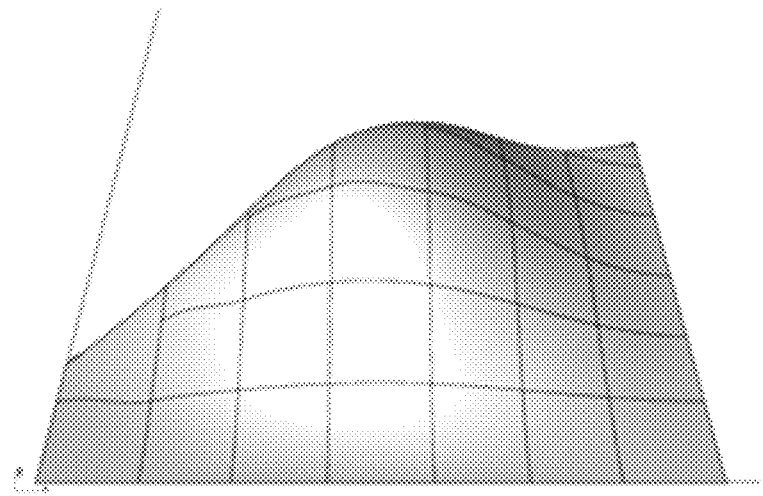
FIG. 11 is an example illustration of a trim-free T-spline surface before approximation techniques are applied.
Figure 12:
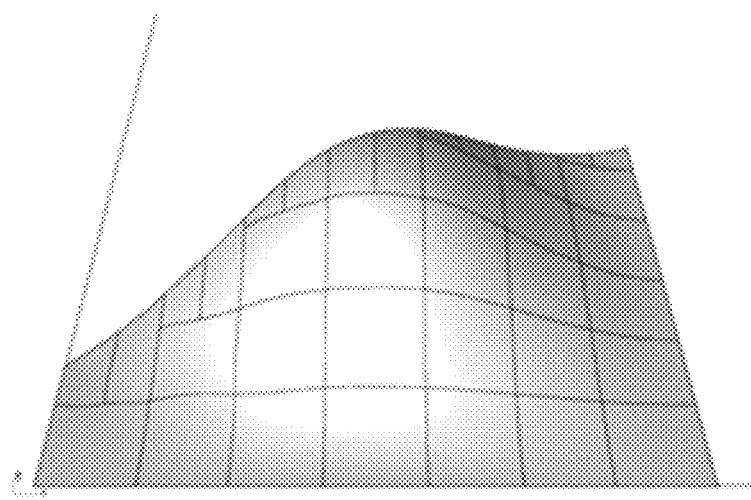
FIG. 12 is an example illustration of a trim-free T-spline surface after approximation techniques are applied.

The system optimizes control point positions in the trim-free T-spline mesh (208). At this point, the trim-free T-spline geometry is a reasonable approximation of the input B-rep face. The system can further reline this approximation by applying global optimization of the control points in the vicinity of the TTM trim boundary. Accordingly, the system applies the following approximation techniques to reposition the control points in a limited band around the trim boundary edges ρ. As a result of repositioning the control points, the trim-free T-spline geometry deviation is reduced to a specified tolerance ϵ>0. FIG. 11 illustrates a trim-free T-spline surface before the approximation techniques are applied. Note that this trim-free T-spline surface does not match the original surface within tolerance. FIG. 12 illustrates the trim-free T-spline surface after the approximation techniques are applied. In FIG. 12, the trim-free T-spline surface includes additional control points and topology, where necessary, and depicts approximation of the trim-free T-spline surface as being sufficiently accurate.

A first approximation technique is a trimming curve approximation. When applying the trimming curve approximation technique, the system approximates a curve c(u) with the corresponding TTS T boundary, e.g., the boundary of the surface in the t parameter direction, β(r) by fitting the boundary control points ($Q_4$) to corresponding positional samples on the curve c(u). The system then interpolates the required number of geometrical properties at the corner points (e.g., tangent direction, curvature). Once this is complete, the system checks the accuracy of the corresponding T boundary β(r) by sampling the curve c(u) in-between the interpolated samples. Next, the system splits the boundary edges ρ where the specified tolerance is violated. These steps are repeated until the trim-free T-spline geometry deviation is reduced to the specified tolerance.

A second approximation technique is boundary tangent field approximation. When applying boundary tangent field approximation, the system first interpolates the mixed input B-rep face derivative ∂S/∂s∂t at the corner points. The system then interpolates the sampled cross-boundary first derivatives of S along the T boundaries using the second row ($Q_3$) of interior control points at the trim boundary. If a boundary tangent field error tolerance is provided, the system checks the approximation and refines the T boundaries if the accuracy tolerance is not satisfied. The system continues interpolating the sampled cross-boundary first derivatives of the input surface S along the T boundaries using the second row ($Q_3$) of interior control points at the trim boundary and checks the approximation and refines the T boundaries if the accuracy tolerance is not satisfied, until the tolerance is satisfied.

A third approximation technique is interior approximation, When applying interior approximation, the system determines the interior region of the TTS affected by the operations described above. Next, the system selects the third row of interior control points at the trim boundary ($Q_2$). The system then solves a constrained least squares problem to reposition these control points to minimize the approximation error between S and T. The system checks the T accuracy by sampling further points inside the affected region and splits the faces where the tolerance is not satisfied. The system continues solving the constrained least squares problem to reposition these control points to minimize the approximation error between S and T, checking the T accuracy by sampling further points inside the affected region, and splits the faces where the tolerance is not satisfied, until the tolerance is satisfied.

Figure 3:
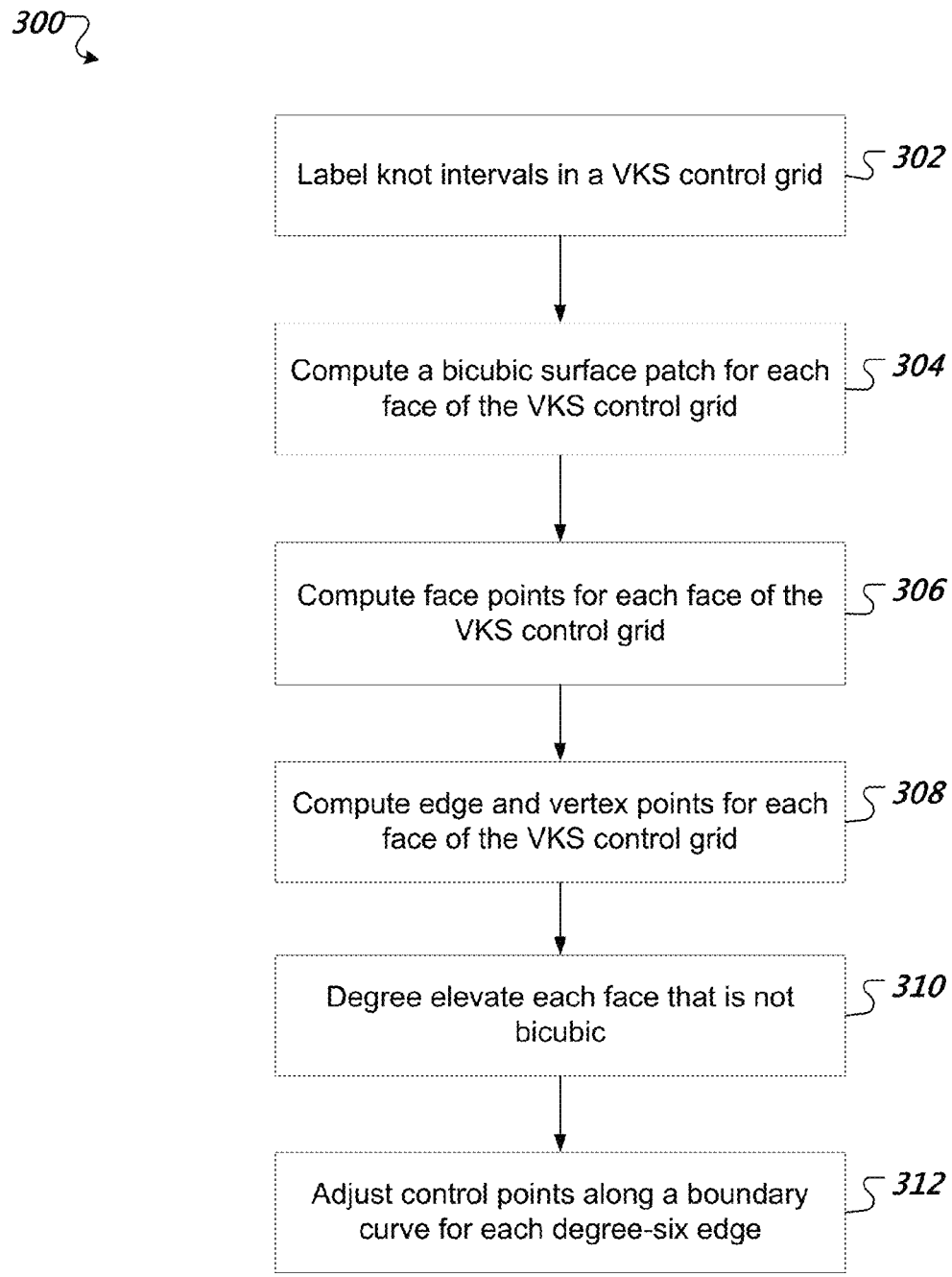
FIG. 3 is a flow diagram of an example technique for redefining a face in the trim-free T-spline mesh as a variable knot spline face.

FIG. 3 is a flow diagram of an example technique 300 for redefining a face in the trim-free T-spline mesh as a variable knot spline face. For convenience, the technique 300 will be described with respect to a system, including one or more data processing apparatus, that performs the technique 300. For example, the technique 300 can be performed by a CAD system, e.g., CAD system 100 of FIG. 1.

Figure 13:
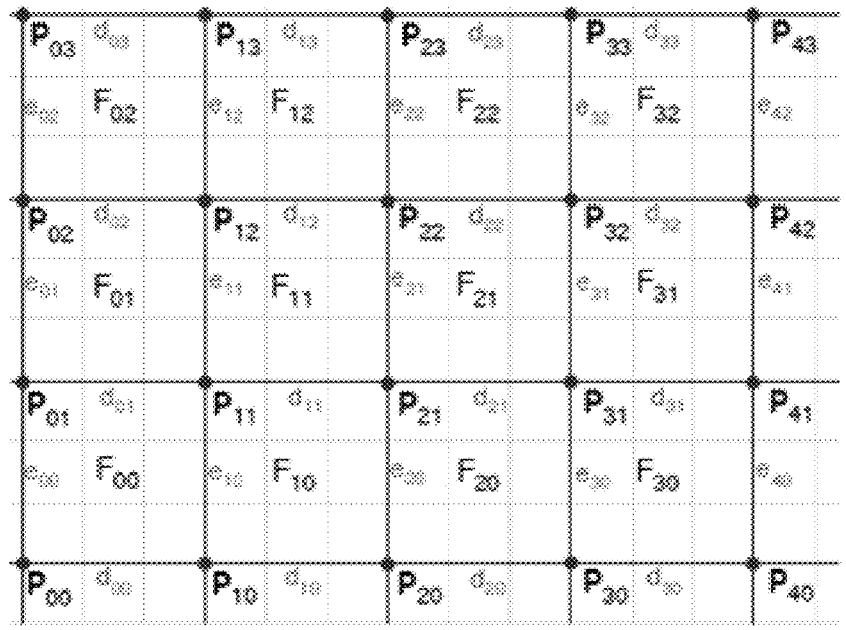
FIG. 13 is an example of a variable knot spline control grid.
Figure 14:
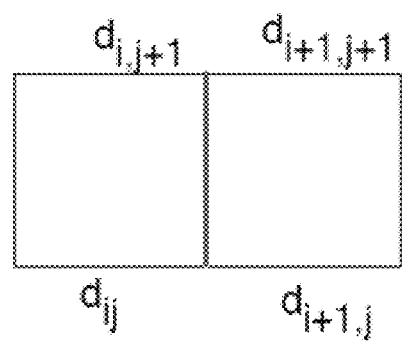
FIG. 14 is an example illustration of a boundary curve between two patches in a variable knot spline.

The system labels knot intervals in VKS control grid (302). For example, as shown in FIG. 13, each face of the VKS control grid 1300 corresponds to one patch on the surface. The degree of each patch can be bicubic, 3×6, 6×3, or 6×6. The degree of a patch is determined by the degree of its boundary curves. Referring to FIG. 14, if $d_{i,j}d_{i+1,j+1} - d_{i,j+1}d_{i+1,j}=0$, then the degree of the boundary curve is three. Otherwise, the degree of the boundary curve is six.

The system computes a bicubic surface patch $Q_{ij}^{3\times 3}$ for each face $F_{ij}$ of the VKS control grid (304).

Figure 15:
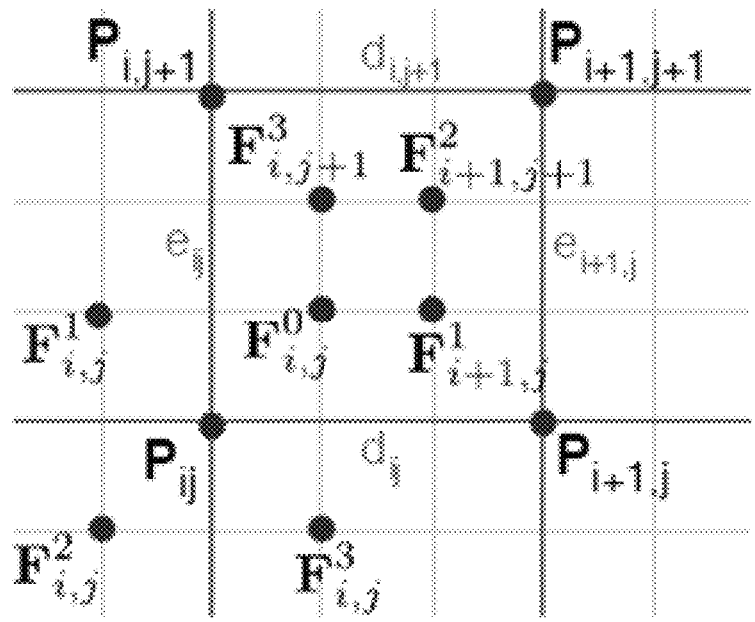
FIG. 15 is an example illustration of face point construction.
Figure 16:
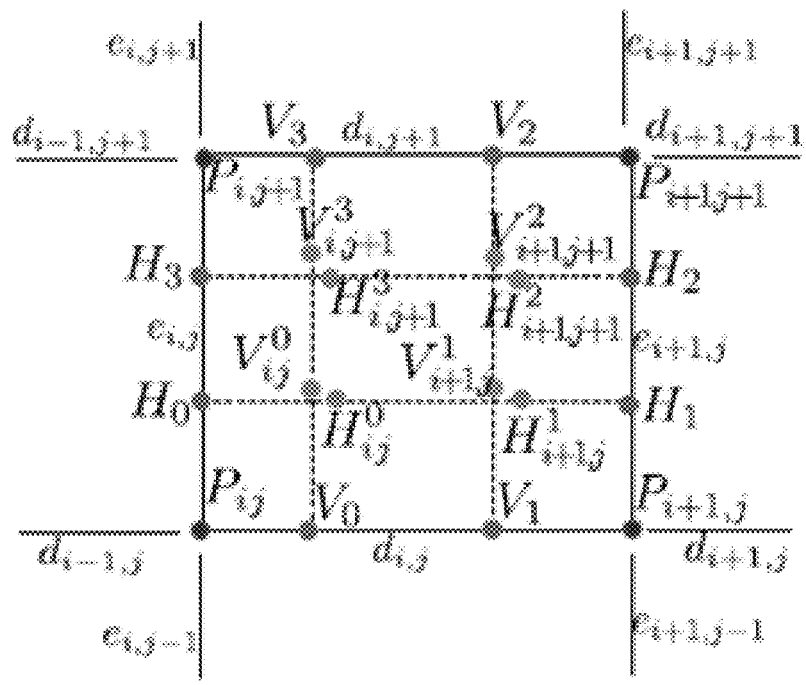
FIG. 16 is an example illustration of computing intermediate points.

The system computes face points for each face of the VKS control grid (306). The system computes each face point $F_{ij}^k$ using the conventional construction for extracting Bézier patches from a bicubic NURBS surface, as shown in FIG. 15. More specifically, for each $F_{ij}^k$, the system uses the knot intervals relative to the face point's closest control point $P_{ij}$. Referring to FIG. 16, the system begins computing face points by computing eight intermediate points $H_i$ and $V_i$, i=0,1,2,3.

The system defines a function for computing face points. One example of such a function is:

$$G(P_1, P_2, a, b, c) = \frac{(b+c)P_1 + aP_2}{a+b+c}, \quad (1)$$

where a, b, c are double-precision floating point values, real numbers, or scalar values, and $P_1$ and $P_2$ are points. Using Equation 1, the system determines the intermediate points $H_i$ and $V_i$ as follows.

$H_0 = G(P_{ij}, P_{i,j+1}, e_{i,j-1}, e_{i,j}, e_{i,j+1})$,
$H_1 = G(P_{i+1,j}, P_{i+1,j+1}, e_{i+1,j-1}, e_{i+1,j}, e_{i+1,j+1})$,
$H_2 = G(P_{i+1,j+1}, P_{i+1,j}, e_{i,j+1}, e_{i+1,j}, e_{i+1,j+1})$,
$H_3 = G(P_{i,j+1}, P_{ij}, e_{i,j+1}, e_{i,j}, e_{i,j-1})$,
$V_0 = G(P_{ij}, P_{i+1,j}, d_{i-1,j}, d_{i,j}, d_{i+1,j})$,
$V_1 = G(P_{i+1,j}, P_{ij}, d_{i+1,j}, d_{i,j}, d_{i-1,j})$,
$V_2 = G(P_{i+1,j+1}, P_{i,j+1}, d_{i+1,j+1}, d_{i,j+1}, d_{i-1,j+1})$,
$V_3 = G(P_{i,j+1}, P_{i+1,j+1}, d_{i-1,j+1}, d_{i,j+1}, d_{i+1,j+1})$.

The system defines a respective measure of how "non-uniform" each of the four boundary edges is:
$\delta_{left} = |d_{i-1,j}d_{i,j+1} - d_{i,j}d_{i-1,j+1}|$,
$\delta_{right} = |d_{i+1,j}d_{i,j+1} - d_{i,j}d_{i+1,j+1}|$,
$\delta_{top} = |e_{i+1,j}e_{i,j+1} - e_{i,j}e_{i+1,j+1}|$,
$\delta_{bottom} = |e_{i+1,j}e_{i,j-1} - e_{i,j}e_{i+1,j-1}|$.

The system then computes the face points using the following table:

| If | then | else |
|---|---|---|
| $\delta_{bottom} \geq \delta_{left}$ | $F_{ij}^0 = V_{ij}^0$ | $F_{ij}^0 = H_{ij}^0$ |
| $\delta_{bottom} \geq \delta_{right}$ | $F_{ij}^1 = V_{ij}^1$ | $F_{ij}^1 = H_{ij}^1$ |
| $\delta_{top} \geq \delta_{right}$ | $F_{ij}^2 = V_{ij}^2$ | $F_{ij}^2 = H_{ij}^2$ |
| $\delta_{top} \geq \delta_{left}$ | $F_{ij}^3 = V_{ij}^3$ | $F_{ij}^3 = H_{ij}^3$ | where:
$H_{ij}^0 = G(H_0, H_1, d_{i-1,j}, d_{i,j}, d_{i+1,j})$,
$H_{i+1,j}^1 = G(H_1, H_0, d_{i+1,j}, d_{i,j}, d_{i-1,j})$,
$H_{i+1,j+1}^2 = G(H_2, H_3, d_{i+1,j+1}, d_{i,j+1}, d_{i-1,j+1})$,
$H_{i,j+1}^3 = G(H_3, H_2, d_{i-1,j+1}, d_{i,j+1}, d_{i+1,j+1})$,
$V_{ij}^0 = G(V_0, V_3, e_{i,j-1}, e_{i,j}, e_{i,j+1})$,
$V_{i+1,j+1}^1 = G(V_2, V_1, e_{i+1,j+1}, e_{i+1,j}, e_{i+1,j-1})$,
$V_{i+1,j}^2 = G(V_1, V_2, e_{e+1,j-1}, e_{i+1,j}, e_{i+1,j+1})$,
$V_{i,j+1}^3 = G(V_3, V_0, e_{i,j+1}, e_{i,j}, e_{i,j-1})$.

If the knot intervals satisfy the NURBS rules, then $\delta_{bottom} = \delta_{top} = \delta_{left} = \delta_{right} = 0$ and $H_{i,j}^k = V_{i,j}^k$.

Figure 17:
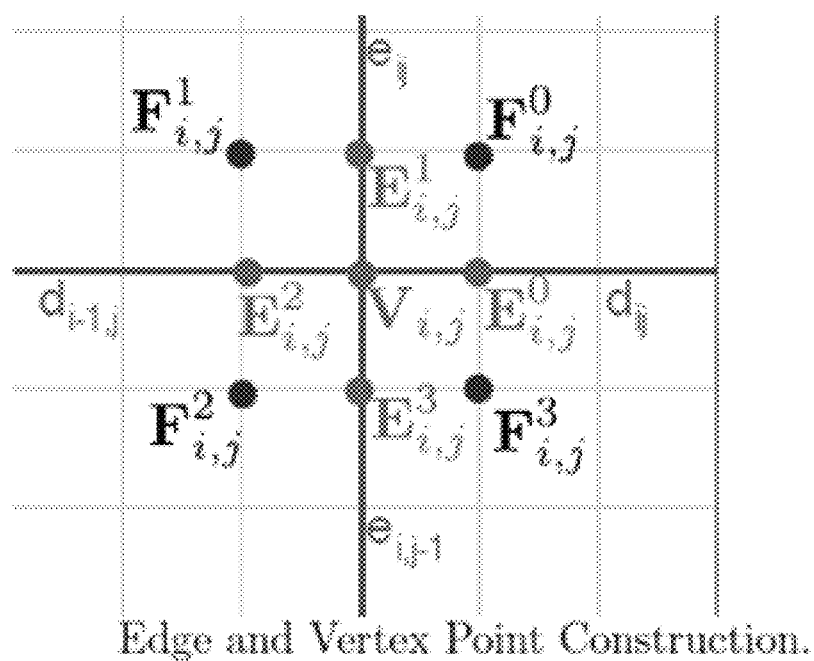
FIG. 17 is an example illustration of edge and vertex point construction.

The system computes edge and vertex points for each face of the VKS control grid (308). Referring to FIG. 17, the system computes each edge point $E_{i,j}^k$ and vertex point $V_{i,j}$ using the conventional construction for extracting Bézier patches from a bicubic NURBS surface, using the knot intervals aligned with $P_{ij}$ to form knot vectors of a bicubic NURBS surface. For each bicubic face $V_{i,j}^k$, a respective $Q_{ij}^{3\times3}$ is the patch corresponding to that face.

The system degree elevates each face that is not bicubic (310). In particular, for each face $F_{ij}$ that is not bicubic, the system degree elevates $Q_{ij}^{3\times3}$ to produce $\tilde{Q}_{ij}^{3\times6}$, $\tilde{Q}_{ij}^{6\times3}$, or $\tilde{Q}_{ij}^{6\times6}$, as appropriate. Each degree-elevated patch is not $G^1$ continuous with all of its neighbors, so the final step is to adjust some control points of each degree-elevated patch to enforce $G^1$ continuity.

Figure 18:
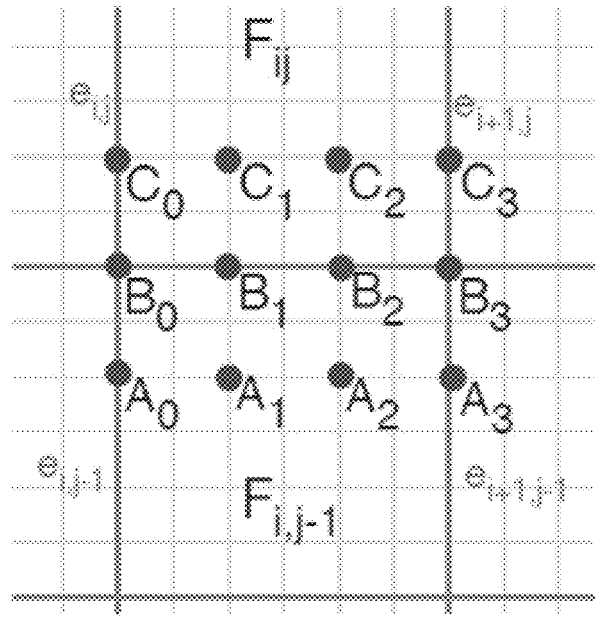
FIG. 18 is an example illustration of a face that maps patches of degree 6×6 prior to degree elevation.
Figure 19:
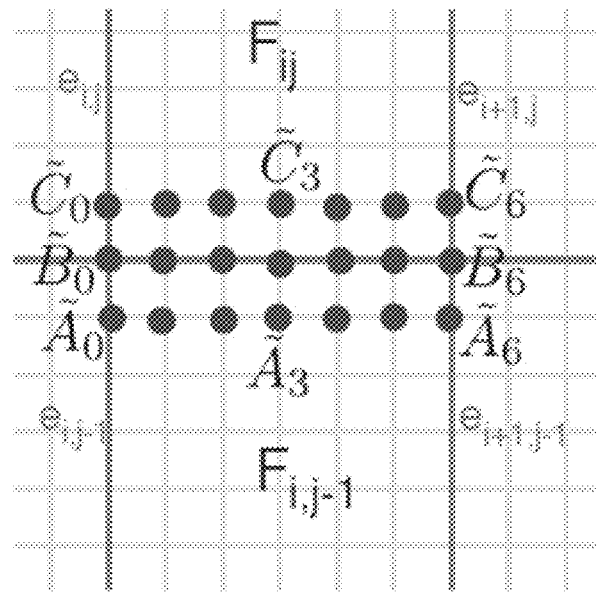
FIG. 19 is an example illustration of a face that maps patches of degree 6×6.

The system adjusts control points along a boundary curve for each degree-six edge (312). In particular, the system adjusts, for each degree-six edge, some control points along the boundary curve to assure $G^1$ continuity. FIGS. 18 and 19 illustrate two faces that map patches of degree 6×6, since the knot intervals at opposite edges are not equal. FIG. 18 illustrates control points from $Q_{ij}^{3\times3}$ and $Q_{i,j-1}^{3\times3}$. FIG. 19 shows control points from $\tilde{Q}_{i,j-1}^{6\times6}$ and $\tilde{Q}_{ij}^{6\times6}$ In this case, $G^1$ continuity is obtained by adjusting $\tilde{B}_i$ by defining:

$$a_0 = \frac{e_{i,j-1}}{e_{i,j-1} + e_{i,j}},\ a_1 = \frac{e_{i+1,j-1}}{e_{i+1,j-1} + e_{i+1,j}},\ c_0 = 1 - a_0,\ c_1 = 1 - a_1.$$

The system defines two polynomials in Bernstein form:

$$a(t)=a_0(1-t)^3+a_1 3t(1-t)^2+a_1 3t^2(1-t)+a_1 t^4,\ c(t)=1-a(t) \quad (2)$$

$G^1$ continuity is achieved by adjusting the control points of $\tilde{B}(t)$, thereby creating a new degree-six boundary curve $\tilde{B}(t)$ where:
B(t)=a(t)C(t)+c(t)A(t).
The control points $\tilde{B}_i$ are:
$\tilde{B}_0=\tilde{B}_0$, $\tilde{B}_1=\tilde{B}_1$, $\tilde{B}_5=\tilde{B}_5$, $\tilde{B}_6=\tilde{B}_6$
Denoting $f(i,j)=a_i C_j + c_i A_j$, the system determines:

$$\tilde{B}_2 = \frac{f(1,0) + 3f(0,1) + f(0,2)}{5} \quad (3)$$

$$\tilde{B}_3 = \frac{f(1,0) + 9f(1,1) + 9f(0,2) + f(0,3)}{20} \quad (4)$$

$$\tilde{B}_4 = \frac{f(1,1) + 3f(1,2) + f(0,3)}{5} \quad (5)$$

The connecting functions a(t) and c(t) having zero derivatives at t=0 and t=1 is significant for this application to variable knot splines. For our purposes, any edge that is constructed using the techniques described above is referred to as a Variable-Knot $G^1$ (VKG$^1$). For example, if two Bézier patches share a VKG$^1$ edge, then the connecting frame a(t) and c(t) have zero derivatives at t=0 and t=1. In particular, if $e_{i,j}e_{i+1,j-1}=e_{i,j-1}e_{i+1,j}$, then VKG$^1$ is equivalent to $C^1$.

Figure 20:
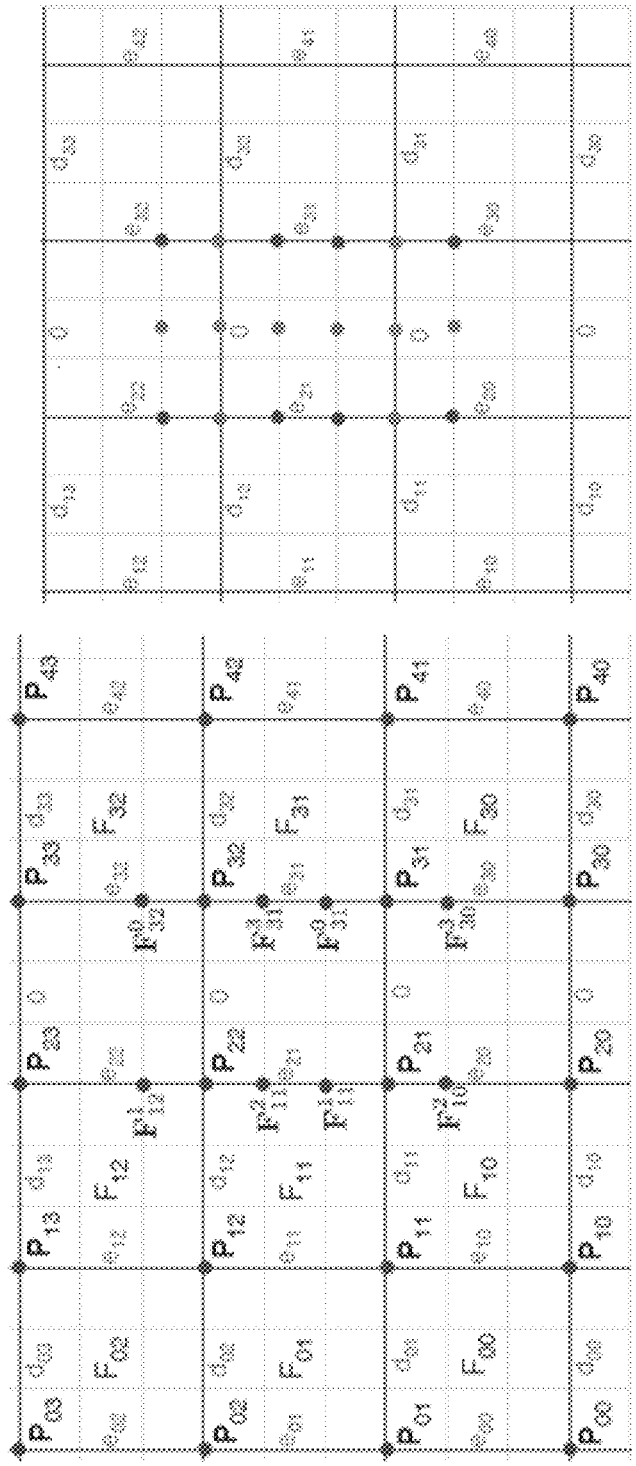
FIG. 20 is an example illustration of a variable knot spline with zero knot intervals.

In some implementations, the system generates face points for zero knot intervals. Zero knot intervals are valuable because they allow more control over the boundary curves and tangency along the boundary curves. The face points in the case of a zero knot interval are functions of a single row of VKS control points. There is no Bézier patch associated with a zero knot interval strip, and the Bézier patches on either side of a degenerate Bézier patch are joined with $G^1$ continuity using the technique 300, described above. FIG. 20 illustrates an example VKS with zero knot intervals.

FIG. 4 is a flow diagram of an example technique for blending variable knot splines that include T-junctions. For convenience, the technique 400 will be described with respect to a system, including one or more data processing apparatus, that performs the technique 400. For example, the technique 400 can be performed by a CAD system, e.g., CAD system 100 of FIG. 1.

The system assigns knot intervals to edges that are split by a T-junction extension (402). Referring to FIGS. 21A and 21B, edges that correspond to edges in a control grid are illustrated using solid lines ("hard edges") while edges created by extending T-Junctions are illustrated using dashed lines ("soft edges"). The rules for determining knot intervals for hard edges are that the sum of the new knot intervals along an edge equals the sum of the original knot intervals along the edge, and the ratios of the knot intervals along an edge equal the ratios of the knot intervals along the opposing edge. If we denote using $\overline{\beta}$ the sum of all knot intervals along the top edge and $\overline{\gamma}$ as the sum of all knot intervals along the left edge, then $$\tilde{\delta}_i = \frac{\overline{\delta}}{\overline{\gamma}}\tilde{\gamma}_i,\ \tilde{\beta}_i = \frac{\overline{\beta}}{\overline{\alpha}}\tilde{\alpha}_i.$$

Knot intervals for soft edges are computed using linear interpolation. Referring to FIG. 21C, each soft edge lies in a rectangle that contains two hard edges that are parallel to the soft edge. As shown in FIG. 21C, we are given the knot intervals $\gamma_0$ and $\gamma_4$ for the corresponding hard edges. To compute knot intervals $\gamma_1$, $\gamma_2$, and $\gamma_3$, the system defines a function for linear interpolation:

$$\gamma(t)=\gamma_0(1-t)+\gamma_4 t,$$

The system then assigns $\gamma_i = \gamma(t_i)$, where $$t_i = \frac{\sum_{j=1}^{i} \tilde{\alpha}_j}{\overline{\alpha}}$$

and $\overline{\alpha}$ is the sum of all the $\overline{\alpha}_j$.

Figure 22:
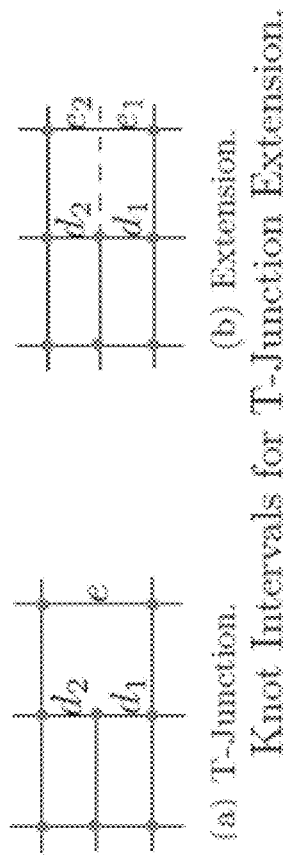
FIG. 22 is an example illustration of knot intervals for a T-junction.

Thus, referring to FIG. 22, for example, the system can assign knot intervals according to:

$$e_2 = \frac{d_2}{d_1 + d_2}e,\ e_1 = \frac{d_1}{d_1 + d_2}e.$$

Figure 23A:
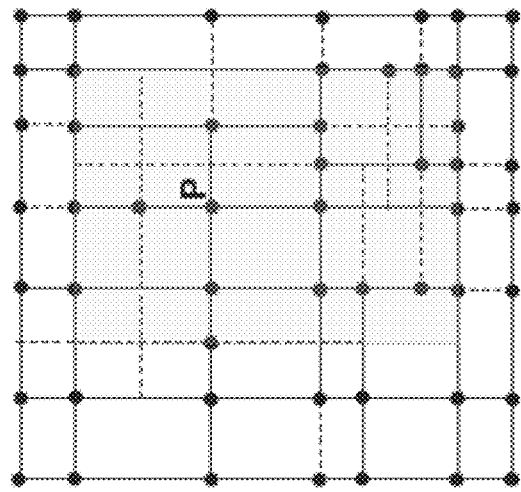
FIGS. 23A-C are example illustrations of a T-VKS.
Figure 23B:
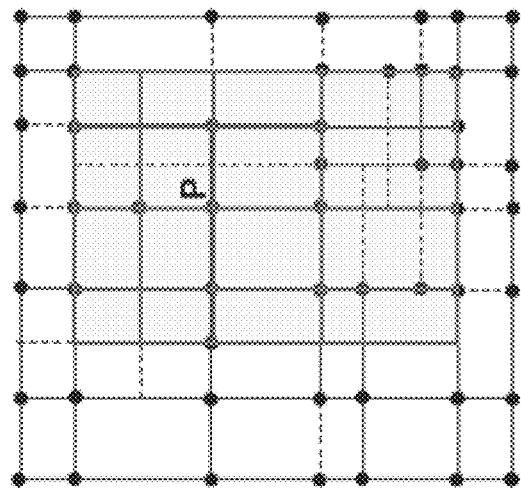
Figure 23C:
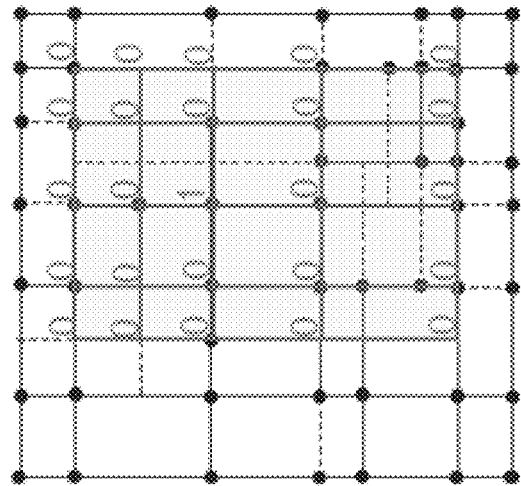

The system defines blending functions for a VKS with T-junctions (404). A VKS with T-junctions ("T-VKS") can be decomposed into a set of Bézier patches so there is a linear map between the T-VKS control points and the Bézier control points. FIGS. 23A-C illustrate an example T-VKS. Each blending function is made up of 16 "macro patches" whose domains are outlined using bold lines in FIGS. 23B. Each macro patch is made up of one or more Bézier patches that are referred to as sub-patches. As used in this specification, there are two different versions of a macro patch. A "bicubic" macro patch is defined by the face, edge, and vertex points, as described in steps 306 and 308 in reference to FIG. 3. A "final" macro patch is a degree 6×6 patch after continuity adjustments have been made. The coefficients of the blending function are scalars. The 16 bicubic macro-patches are obtained from the VKS, as shown in FIG. 23C, where the coefficients of 24 of the VKS control points are zero and the other coefficient is one. Further, nine of the macro patches in FIG. 23C consist of a single sub-patch. The control points of the final version of such patches obtained using the technique 300 described in reference to FIG. 3. The other seven macro patches in FIG. 23C are split into two or more sub-patches, as described below.

The system splits macro patches into sub-patches (406). The process for splitting a macro patch into sub-patches satisfies three conditions. First, if the knot intervals satisfy the T-spline knot interval requirements, e.g., the sum of all knot intervals on one side of a face equals the sum of knot intervals on the opposing side, the procedure must replicate T-splines, Second, if there are no T-junctions, the procedure must replicate VKS. Third, the connecting functions between each pair of adjacent sub-patches must be the same for all blending functions in which that pair of sub-patches appears. The second and third conditions require that all edges must be $VKG^1$, as described in reference to FIG. 3.

An example T-mesh pre-image of a macro patch is illustrated in FIG. 24A. The domain of each macro patch is split topologically into rectangles, which are the domains of the sub-patches, that are bounded by hard or soft edges that meet at vertices, as shown in FIG. 24B.

The system determines a pair of tangent strips for each edge and then uses those tangent strips to define the outermost two rows of control points for the sub-patches (408). A tangent strip is a degree 1×6 Bézier patch that defines the first partial derivative vector function along each hard and soft edge. In particular, the tangent strip is the first two rows of control points of a degree 6×6 Bézier patch.

To create a tangent strip, the system first defines "local knot coordinates" with respect to each vertex by temporarily extending all T-Junctions within the macro patch all the way across the patch. Referring to FIG. 25A, the system computes the local knot coordinates for $P^{43}$ which lies on the $4^{th}$ column and $3^{rd}$ row by first determining the knot intervals $d_i$ for the edges made up of the rows of edges that contain $P^{43}$. The local s knot coordinate for $P^{43}$ is then:

$$s_i^{43} = \frac{\sum_{j=1}^{i} d_j}{\sum_{j=1}^{6} d_j}.$$

The local t knot coordinate for $P^{43}$ is computed similarly using the column of edges containing $P^{43}$. The local knot coordinates for $P^{43}$ are thus $(s_4^{43}, t_3^{43})$. The local knot values illustrated in FIG. 25A are generally different with respect to different vertices, however, $S_i^{ij} \leq s_{i+1}^{i+1,j}$ and $t_i^{ij} \leq t_{j+1}^{i,j+1}$ are assured. It is possible for two vertices on different rows and columns to have the same local knot coordinates.

Tangent strips for hard edges are created for each portion of the hard edge that is bounded by control points. The system begins computing the tangent strips by computing $A_i$ and $C_i$ Bézier control points. As described above, the macro patch is a bictibic Bézier patch over the [0,1]×[0,1] domain. Thus, the macro patch's bottom row of control points have polar labels (0,0,0)×(0,0,0), (1.0,0)×(0,0,0), (1,1,0)×(0,0,0), and (1,1,1)×(0,0,0). The $A_i$ and $C_i$ have the following polar labels:

$A_0 = (s_2^{32}, s_3^{32}, s_3^{32}) \times (t_2^{32}, t_2^{32}, t_2^{32}), C_0 = (s_3^{32}, s_3^{32}, s_4^{32}) \times (t_2^{32}, t_2^{32}, t_2^{32})$ $A_1 = (s_2^{32}, s_3^{32}, s_3^{32}) \times (t_2^{32}, t_2^{32}, t_5^{32}), C_1 = (s_3^{32}, s_3^{32}, s_4^{32}) \times (t_2^{32}, t_2^{32}, t_5^{32})$ $A_2 = (s_2^{35}, s_3^{35}, s_3^{35}) \times (t_2^{35}, t_5^{35}, t_5^{35}), C_2 = (s_3^{35}, s_3^{35}, s_4^{35}) \times (t_2^{35}, t_5^{35}, t_5^{35})$ $A_3 = (s_2^{35}, s_3^{35}, s_3^{35}) \times (t_5^{35}, t_5^{35}, t_5^{35}), C_3 = (s_3^{35}, s_3^{35}, s_4^{35}) \times (t_5^{35}, t_5^{35}, t_5^{35})$ If the coefficients of the 16 coefficients for the macro patch are $f_{i,j}$, then these polar values can be computed as follows:

$$(s_1, s_2, s_3) \times (t_1, t_2, t_3) = T \begin{bmatrix} f_{03} & f_{13} & f_{23} & f_{33} \\ f_{02} & f_{12} & f_{22} & f_{32} \\ f_{03} & f_{11} & f_{21} & f_{31} \\ f_{00} & f_{10} & f_{20} & f_{30} \end{bmatrix} S^T$$

where:
$T = [t_1 t_2 t_3, t_1 t_2 \bar{t}_3 + t_1 \bar{t}_2 t_3 + \bar{t}_1 t_2 t_3, t_1 \bar{t}_2 \bar{t}_3 + \bar{t}_1 t_2 \bar{t}_3 + \bar{t}_1 \bar{t}_2 t_3, \bar{t}_1 \bar{t}_2 \bar{t}_3]$,
$S = [\bar{s}_1 \bar{s}_2 \bar{s}_3, \quad s_1 \bar{s}_2 \bar{s}_3 + \bar{s}_1 s_2 \bar{s}_3 + \bar{s}_1 \bar{s}_2 s_3, \quad s_1 s_2 \bar{s}_3 + s_1 \bar{s}_2 s_3 + \bar{s}_1 s_2 s_3, s_1 s_2 s_3]$,
with $\bar{s}_i = (1-s_i)$ and $\bar{t}_i = (1-t_i)$.

Figure 26:
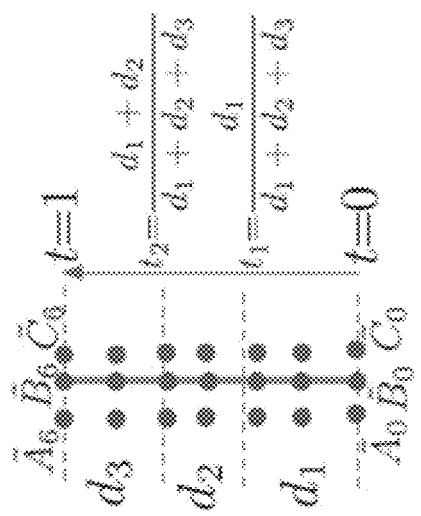
FIG. 26 is an example illustration of splitting a tangent strip

The system then computes the points $\tilde{A}_i, \tilde{B}_i, \tilde{C}_i$ using the technique described in reference to FIG. 3. For hard edges that are intersected by one or more soft edges, the tangent strip is split at the soft edges using the de Casteljau algorithm. For example, the tangent strip in FIG. 25C is split twice, as shown in FIG. 26. If a soft edge terminates at hard edge, e.g., from the side of the $\tilde{A}_i$ curve, the system makes a copy of the $\tilde{B}_i$ control points and then splits the $\tilde{A}_i$ curve and one copy of the $\tilde{B}_i$ curve. If two hard edges meet at a. vertex, then their tangent strips will share several control points. Note that in the construction described, shared control points will always be in identical positions. If the green edge is an outer boundary of the blending function, then the $A_i$ and $C_i$ points are all zero.

The system then computes tangent strips for soft edges. For a soft edge segment that terminates at a hard edge, the two final control points for its tangent strip are taken from the hard edge. FIGS. 27A-D illustrate a portion of the control mesh from FIGS. 25A-C, where $B_0$ is heated at knot coordinates (2, 4). Accordingly, the system beings by computing control points:

$B_0 = (s_2^{24}, s_2^{24}, s_2^{24}) \times (t_4^{24}, t_4^{24}, t_4^{24}), A_0 = (s_2^{24}, s_2^{24}, s_2^{24}) \times (t_4^{24}, t_4^{24}, t_5^{24})$ $B_1 = (s_2^{24}, s_2^{24}, s_3^{24}) \times (t_4^{24}, t_4^{24}, t_4^{24}), A_1 = (s_2^{24}, s_2^{24}, s_3^{24}) \times (t_4^{24}, t_4^{24}, t_5^{24})$.

Since these control points are for bicubic Bézier patches, we "degree elevate" these control points so that they can serve as control points for the degree six tangent strips:

$$\tilde{B}_0 = B_0, \tilde{B}_1 = \frac{B_0 + B_1}{2}, \tilde{A}_0 = \frac{A_0 + B_0}{2}, \tilde{A}_1 = \frac{A_0 + A_1 + B_0 + B_1}{4}.$$

From these degree elevated control points, the system computes:

$$\tilde{A}_2 = \frac{2\tilde{A}_5 - \tilde{A}_6 + 6\tilde{A}_1 - 2\tilde{A}_0}{5}, \tilde{A}_3 = \frac{-4\tilde{A}_6 + 9\tilde{A}_5 + 9\tilde{A}_1 - 4\tilde{A}_0}{10},$$

$$\tilde{A}_4 = \frac{-2\tilde{A}_6 + 6\tilde{A}_5 + 2\tilde{A}_1 - \tilde{A}_0}{5},$$

$$\tilde{B}_2 = \frac{2\tilde{B}_5 - \tilde{B}_6 + 6\tilde{B}_1 - 2\tilde{B}_0}{5}, \tilde{B}_3 = \frac{-4\tilde{B}_6 + 9\tilde{B}_5 + 9\tilde{B}_1 - 4\tilde{B}_0}{10},$$

$$\tilde{B}_4 = \frac{-2\tilde{B}_6 + 6\tilde{B}_5 + 2\tilde{B}_1 - \tilde{B}_0}{5}.$$

Consequently, the tangent strip control points form the outer two rows of control points for each edge of each sub-patch, as shown in FIG. 27A. Next, the system computes the nine interior control points, as shown in the dotted box 2702. The nine interior control points are computed as linear combinations for the 16 blue control points, as shown in the dotted boxes 2704. FIG. 27A-C illustrate the masks for computing each of the nine control points from the 16 corner control points. Upon completing this computation, the system has determined control points for all Bézier patches that include a macro-patch.

In some implementations, the system can alternatively determine the control points by first finding the Bézier patches whose domains are defined using the one-bay extensions, as shown in FIG. 28A using dotted lines. Any of those patches that is cut by a two-bay extension, as depicted using long-dash lines 2802, in FIG. 28B is then split using the de Casteljau algorithm. In contrast to the techniques described above, which result in producing Bézier patches that are generally $C^1$ across the long-dash line extensions, in such implementations, the result is Bézier patches that arc $C^3$ across the long-dash line edges.

Embodiments of the subject matter and the operations described in this specification can be implemented in digital electronic circuitry, or in computer software, firmware, or hardware, including the structures disclosed in this specification and their structural equivalents, or in combinations of one or more of them. Embodiments of the subject matter described in this specification can be implemented as one or more computer programs, i.e., one or more modules of computer program instructions, encoded on computer storage medium for execution by, or to control the operation of, data processing apparatus. Alternatively or in addition, the program instructions can be encoded on an artificially-generated propagated signal, e.g., a machine-generated electrical, optical, or electromagnetic signal, that is generated to encode information for transmission to suitable receiver apparatus for execution by a data processing apparatus. A computer storage medium can be, or be included in, a computer-readable storage device, a computer-readable storage substrate, a random or serial access memory array or device, or a combination of one or more of them, Moreover, while a computer storage medium is not a propagated signal, a computer storage medium can be a source or destination of computer program instructions encoded in an artificially-generated propagated signal. The computer storage medium can also be, or be included in, one or more separate physical components or media (e.g., multiple CDs, disks, or other storage devices).

The operations described in this specification can be implemented as operations performed by a data processing apparatus on data stored on one or more computer-readable storage devices or received from other sources.

The term "data processing apparatus" encompasses all kinds of apparatus, devices, and machines for processing data., including by way of example a programmable processor, a computer, a system on a chip, or multiple ones, or combinations, of the foregoing The apparatus can include special purpose logic circuitry, e.g., an FPGA (field programmable gate array) or an ASIC (application-specific integrated circuit). The apparatus can also include, in addition to hardware, code that creates an execution environment for the computer program in question, e.g., code that constitutes processor firmware, a protocol stack, a database management system, an operating system, a. cross-platform runtime environment, a virtual machine, or a combination of one or more of them. The apparatus and execution environment can realize various different computing model infrastructures, such as web services, distributed computing and grid computing, infrastructures.

A computer program (also known as a program, software, software application, script, or code) can be written in any form of programming language, including compiled or interpreted languages, declarative or procedural languages, and it can be deployed in any form, including as a stand-alone program or as a module, component, subroutine, object, or other unit suitable for use in a computing environment. A computer program may, but need not, correspond to a file in a file system. A program can be stored in a portion of a file that holds other programs or data (e.g., one or more scripts stored in a markup language resource), in a single file dedicated to the program in question, or in multiple coordinated files (e.g., files that store one or more modules, sub-programs, or portions of code). A computer program can be deployed to be executed on one computer or on multiple computers that are located at one site or distributed across multiple sites and interconnected by a communication network.

The processes and logic flows described in this specification can be performed by one or int re programmable processors executing one or more computer programs to perform actions by operating on input data and generating output. The processes and logic flows can also be performed by, and apparatus can also be implemented as, special purpose logic circuitry, e.g., FPGA (field programmable gate array) or an ASIC (application-specific integrated circuit).

Processors suitable for the execution of a computer program include, by way of example, both general and special purpose microprocessors, and any one or more processors of any kind of digital computer. Generally, a processor will receive instructions and data from a read-only memory or a random access memory or both. The essential elements of a computer are a processor for performing actions in accordance with instructions and one or more memory devices for storing instructions and data. Generally, a computer will also include, or be operatively coupled to receive data from or transfer data to, or both, one or more mass storage devices for storing data, e.g., magnetic, magneto-optical disks, or optical disks. However, a computer need not have such devices. Moreover, a computer can be embedded in another device, e.g., a mobile telephone, a personal digital assistant (PDA), a mobile audio or video player, a game console, a Global Positioning System (GPS) receiver, or a portable storage device (e.g., a universal serial bus (USB) flash drive), to name just a few. Devices suitable for storing computer program instructions and data include all forms of non-volatile memory, media and memory devices, including by way of example semiconductor memory devices, e.g., EPROM, EEPROM, and flash memory devices; magnetic disks, e.g., internal hard disks or removable disks; magneto-optical disks; and CD-ROM and DVD-ROM disks. The processor and the memory can be supplemented by, or incorporated in, special purpose logic circuitry.

To provide for interaction with a user, embodiments of the subject matter described in this specification can be implemented on a computer having a display device, e.g., a CRT (cathode ray tube) or LCD (liquid crystal display) monitor, for displaying information to the user and a keyboard and a pointing device, e.g., a mouse or a trackball, by which the user can provide input to the computer. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input. In addition, a computer can interact with a user by sending resources to and receiving resources from a device that is used by the user; for example, by sending web pages to a web browser on a user's client device in response to requests received from the web browser.

Embodiments of the subject matter described in this specification can be implemented in a computing system that includes a back-end component, e.g., as a data server, or that includes a middleware component, e.g., an application server, or that includes a front-end component, e.g., a client computer having a. graphical user interface or a Web browser through which a user can interact with an implementation of the subject matter described in this specification, or any combination of one or more such back-end, middleware, or front-end components. The components of the system can be interconnected by any form or medium of digital data communication, e.g., a communication network. Examples of communication networks include a local area network ("LAN") and a wide area network ("WAN"), an inter-network (e.g., the Internet), and peer-to-peer networks (e.g., ad hoc peer-to-peer networks).

The computing system can include clients and servers. A client and server are generally remote from each other and typically interact through a communication network.

The relationship of client and server arises by virtue of computer programs running on the respective computers and having a client-server relationship to each other. In some embodiments, a server transmits data. (e.g., an HTML page) to a client device (e.g., for purposes of displaying data to and receiving user input from a user interacting with the client device). Data generated at the client device (e.g., a result of the user interaction) can be received from the client device at the server.

A system of one or more computers can be configured to perform particular operations or actions by virtue of having software, firmware, hardware, or a combination of them installed on the system that in operation causes or cause the system to perform the actions. One or more computer programs can be configured to perform particular operations or actions by virtue of including instructions that, when executed by data processing apparatus, cause the apparatus to perform the actions.

While this specification contains many specific implementation details, these should not be construed as limitations on the scope of any inventions or of what may be claimed, but rather as descriptions of features specific to particular embodiments of particular inventions. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination, Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

Thus, particular embodiments of the stibject matter have been described. Other embodiments are within the scope of the following claims. In some cases, the actions recited in the claims can be performed in a different order and still achieve desirable results. In addition, the processes depicted in the accompanying figures do not necessarily require the particular order shown, or sequential order, to achieve desirable results. In certain implementations, multitasking and parallel processing may be advantageous.

What is claimed is:

1. A computer-implemented method comprising:
   receiving an input boundary representation (B-rep) face and an associated functional trimming curve;
   constructing a trim-free T-spline control mesh for a NURBS surface control grid of the input B-rep face;
   aligning the trim-free T-spline control mesh with the functional trimming curve; and
   generating a representation of the input B-rep face using untrimmed bicubic surface patches for each of one or more faces in the aligned trim-free T-spline control mesh that are adjacent to the functional trimming curve, wherein each bicubic surface patch is represented by a variable knot spline, and wherein at least one bicubic surface patch has a first sum of knot intervals on a first edge of the patch that does not equal a second sum of knot intervals on an opposing second edge of the bicubic surface patch.

2. The method of claim 1, further comprising adjusting control points of one or more of the untrimmed bicubic surface patches so that each bicubic surface patch is G1 continuous with all of its neighboring patches.

3. The method of claim 1, wherein generating the representation of the input B-rep face using untrimmed bicubic surface patches comprises:
   labeling knot intervals in a variable knot spline control grid, the variable knot spline control grid corresponding to the control grid of the input B-rep face;
   generating a bicubic surface patch for one or more faces of the variable knot spline control grid; and
   adjusting control points along a boundary curve for one or more edges in each face that has a degree of six.

4. The method of claim 3, further comprising generating respective face points for each face of the variable knot spline control grid including computing respective edge and vertex points for each face of the variable knot spline control grid.

5. The method of claim 3, further comprising generating respective face points for each face of the variable knot spline control grid including generating respective face points for zero knot intervals in the variable knot spline control grid.

6. The method of claim 3, further comprising generating respective variable knot spline face points for each face of the variable knot spline control grid.

7. The method of claim 1, wherein at least one bicubic surface patch of the untrimmed bicubic surface patches is represented by a variable knot spline that includes T-junctions, and wherein generating the representation of the input B-rep face comprises:
   assigning knot intervals to one or more edges that are split by a T-junction extension;

defining one or more blending functions for one or more variable knot splines with T-junctions;

splitting one or more macro patches into respective sub-patches;

determining respective pairs of tangent strips for each edge in the one or more edges; and defining respective outermost two rows of control points for the respective sub-patches based on the respective pairs of tangent strips for the one or more edges.

8. The method of claim 6, wherein control points for variable knot splines with T-junctions are linearly mapped to corresponding Bézier control points.

9. The method of claim 1, wherein generating the representation of the input B-rep face using untrimmed bicubic surface patches for each face in the aligned trim-free T-spline control mesh that is adjacent to the functional trimming curve comprises:

optimizing control point positions in the trim-free T-spline control mesh.

10. A non-transitory computer storage medium having instructions stored thereon that, when executed by data processing apparatus, cause the data processing apparatus to perform operations comprising:

receiving an input boundary representation (B-rep) face and an associated functional trimming curve;

constructing a trim-free T-spline control mesh for a NURBS surface control grid of the input B-rep face;

aligning the trim-free T-spline control mesh with the functional trimming curve; and generating a representation of the input B-rep face using untrimmed bicubic surface patches for each of one or more faces in the aligned trim-free T-spline control mesh that are adjacent to the functional trimming curve, wherein each bicubic surface patch is represented by a variable knot spline, and wherein at least one bicubic surface patch has a first sum of knot intervals on a first edge of the patch that does not equal a second sum of knot intervals on an opposing second edge of the bicubic surface patch.

11. The medium of claim 10, further comprising adjusting control points of one or more of the untrimmed bicubic surface patches so that each bicubic surface patch is G1 continuous with all of its neighboring patches.

12. The medium of claim 10, wherein generating the representation of the input B-rep face using untrimmed bicubic surface patches comprises:

labeling knot intervals in a variable knot spline control grid, the variable knot spline control grid corresponding to the control grid of the input B-rep face;

generating a bicubic surface patch for one or more faces of the variable knot spline control grid; and adjusting control points along a boundary curve for one or more edges in each face that has a degree of six.

13. The medium of claim 12, further comprising generating respective face points for each face of the variable knot spline control grid including computing respective edge and vertex points for each face of the variable knot spline control grid.

14. The medium of claim 12, further comprising generating respective face points for each face of the variable knot spline control grid including generating respective face points for zero knot intervals in the variable knot spline control grid.

15. The medium of claim 12, further comprising generating respective variable knot spline face points for each face of the variable knot spline control grid.

16. The medium of claim 10, wherein at least one bicubic surface patch of the untrimmed bicubic surface patches is represented by a variable knot spline that includes T-junctions, and wherein generating the representation of the input B-rep face comprises:

assigning knot intervals to one or more edges that are split by a T-junction extension;

defining one or more blending functions for one or more variable knot splines with T-junctions;

splitting one or more macro patches into respective sub-patches;

determining respective pairs of tangent strips for each edge in the one or more edges; and defining respective outermost two rows of control points for the respective sub-patches based on the respective pairs of tangent strips for the one or more edges.

17. The medium of claim 16, wherein control points for variable knot splines with T-junctions are linearly mapped to corresponding Bézier control points.

18. The medium of claim 10, wherein generating the representation of the input B-rep face using untrimmed bicubic surface patches for each face in the aligned trim-free T-spline control mesh that is adjacent to the functional trimming curve comprises:

optimizing control point positions in the trim-free T-spline control mesh.

19. A system comprising:

one or more computers and one or more storage devices storing instructions that are operable, when executed by the one or more computers, to cause the one or more computers to perform operations comprising:

receiving an input boundary representation (B-rep) face and an associated functional trimming curve;

constructing a trim-free T-spline control mesh for a NURBS surface control grid of the input B-rep face;

aligning the trim-free T-spline control mesh with the functional trimming curve; and generating a representation of the input B-rep face using untrimmed bicubic surface patches for each of one or more faces in the aligned trim-free T-spline control mesh that are adjacent to the functional trimming curve, wherein each bicubic surface patch is represented by a variable knot spline, and wherein at least one bicubic surface patch has a first sum of knot intervals on a first edge of the patch that does not equal a second sum of knot intervals on an opposing second edge of the bicubic surface patch.

20. The system of claim 19, further comprising adjusting control points of one or more of the untrimmed bicubic surface patches so that each bicubic surface patch is G1 continuous with all of its neighboring patches.

21. The system of claim 19, wherein generating the representation of the input B-rep face using untrimmed bicubic surface patches comprises:

labeling knot intervals in a variable knot spline control grid, the variable knot spline control grid corresponding to the control grid of the input B-rep face;

generating a bicubic surface patch for one or more faces of the variable knot spline control grid; and adjusting control points along a boundary curve for one or more edges in each face that has a degree of six.

22. The system of claim 21, further comprising generating respective face points for each face of the variable knot spline control grid including computing respective edge and vertex points for each face of the variable knot spline control grid.

23. The system of claim 21, further comprising generating respective face points for each face of the variable knot spline control grid including generating respective face points for zero knot intervals in the variable knot spline control grid.

24. The system of claim 21, further comprising generating respective variable knot spline face points for each face of the variable knot spline control grid.

25. The system of claim 19, wherein at least one bicubic surface patch of the untrimmed bicubic surface patches is represented by a variable knot spline that includes T-junctions, and wherein generating the representation of the input B-rep face comprises:
   assigning knot intervals to one or more edges that are split by a T-junction extension;
   defining one or more blending functions for one or more variable knot splines with T-junctions;
   splitting one or more macro patches into respective sub-patches;
   determining respective pairs of tangent strips for each edge in the one or more edges; and
   defining respective outermost two rows of control points for the respective sub-patches based on the respective pairs of tangent strips for the one or more edges.

26. The system of claim 25, wherein control points for variable knot splines with T-junctions are linearly mapped to corresponding Bézier control points.

27. The system of claim 19, wherein generating the representation of the input B-rep face using untrimmed bicubic surface patches for each face in the aligned trim-free T-spline control mesh that is adjacent to the functional trimming curve comprises:
   optimizing control point positions in the trim-free T-spline control mesh.

* * * * *

UNITED STATES PATENT AND TRADEMARK OFFICE
CERTIFICATE OF CORRECTION

PATENT NO. : 9,269,189 B1
APPLICATION NO. : 13/827243
DATED : February 23, 2016
INVENTOR(S) : Martin Cvetanov Marinov et al.

Page 1 of 1

It is certified that error appears in the above-identified patent and that said Letters Patent is hereby corrected as shown below:

In the claims,

Column 17, line 10, in claim 8: delete "claim 6," and insert --claim 7,--.

Signed and Sealed this
Fifth Day of July, 2016

Michelle K. Lee
*Director of the United States Patent and Trademark Office*